United States Patent [19]

Sawada et al.

[11] Patent Number: 5,471,430
[45] Date of Patent: Nov. 28, 1995

[54] TEST CIRCUIT FOR REFRESH COUNTER OF CLOCK SYNCHRONOUS TYPE SEMICONDUCTOR MEMORY DEVICE

[75] Inventors: Seiji Sawada; Yasuhiro Konishi, both of Hyogo, Japan

[73] Assignee: Mitsubishi Denki Kabushiki Kaisha, Tokyo, Japan

[21] Appl. No.: 245,784

[22] Filed: May 19, 1994

[30] Foreign Application Priority Data

May 24, 1993 [JP] Japan .................................. 5-121179

[51] Int. Cl.$^6$ .................................................. G11C 11/34
[52] U.S. Cl. ...................................... 365/222; 365/230.03
[58] Field of Search ................................ 365/222, 230.03, 365/198

[56] References Cited

U.S. PATENT DOCUMENTS

| | | | |
|---|---|---|---|
| 4,677,592 | 6/1987 | Sakurai et al. | 365/222 |
| 4,933,907 | 6/1990 | Kumanoya et al. | 365/222 |
| 5,021,951 | 6/1991 | Baba | 365/222 |
| 5,239,505 | 8/1993 | Fazio et al. | 365/222 |
| 5,299,168 | 3/1994 | Kang | 365/222 |
| 5,321,661 | 6/1994 | Iwakiri et al. | 365/222 |

Primary Examiner—David C. Nelms
Assistant Examiner—Son Dinh
Attorney, Agent, or Firm—Lowe, Price, LeBlanc & Becker

[57] ABSTRACT

A synchronous semiconductor memory device includes an automatic refresh detection circuit for detecting that an automatic refresh mode is specified in accordance with an automatic refresh command, an address counter for generating a refresh address, a refresh execution unit for refreshing a memory array in accordance with an automatic refresh detection signal and the refresh address, an inactivation circuit for inactivating the refresh execution unit after a lapse of a prescribed time in accordance with the automatic refresh detection signal, a counter check mode detection circuit for bringing the inactivation circuit into an inoperable state in accordance with a counter check mode command, and a second inactivation circuit for inactivating the refresh execution unit in accordance with a precharge detection signal generated in response to a precharge command. Thus synchronous semiconductor memory device with an operation mode which can test the function of an internal refresh address counter is provided.

29 Claims, 21 Drawing Sheets

FIG. 5

| FUNCTION | /CS | /RAS | /CAS | /WE | DQM(IOE&WM) |
|---|---|---|---|---|---|
| ROW ADDRESS STROBE AND ARRAY ACTIVATION | L | L | H | H | — |
| COLUMN ADDRESS STROBE AND READ | L | H | L | H | — |
| COLUMN ADDRESS STROBE AND WRITE | L | H | L | L | — |
| PRECHARGE (ARRAY INACTIVATION) | L | L | H | L | — |
| REFRESH | L | L | L | H | — |
| MODE REGISTER SET | L | L | L | L | — |
| WRITE ENABLE / OUTPUT ENABLE | — | — | — | — | L |
| WRITE MASK / OUTPUT DISABLE | — | — | — | — | H |
| NO CHANGE | L | H | H | H | — |
| IGNORE /RAS, /CAS & /WE | H | X | X | X | — |

(TO ROW SELECTION SYSTEM)

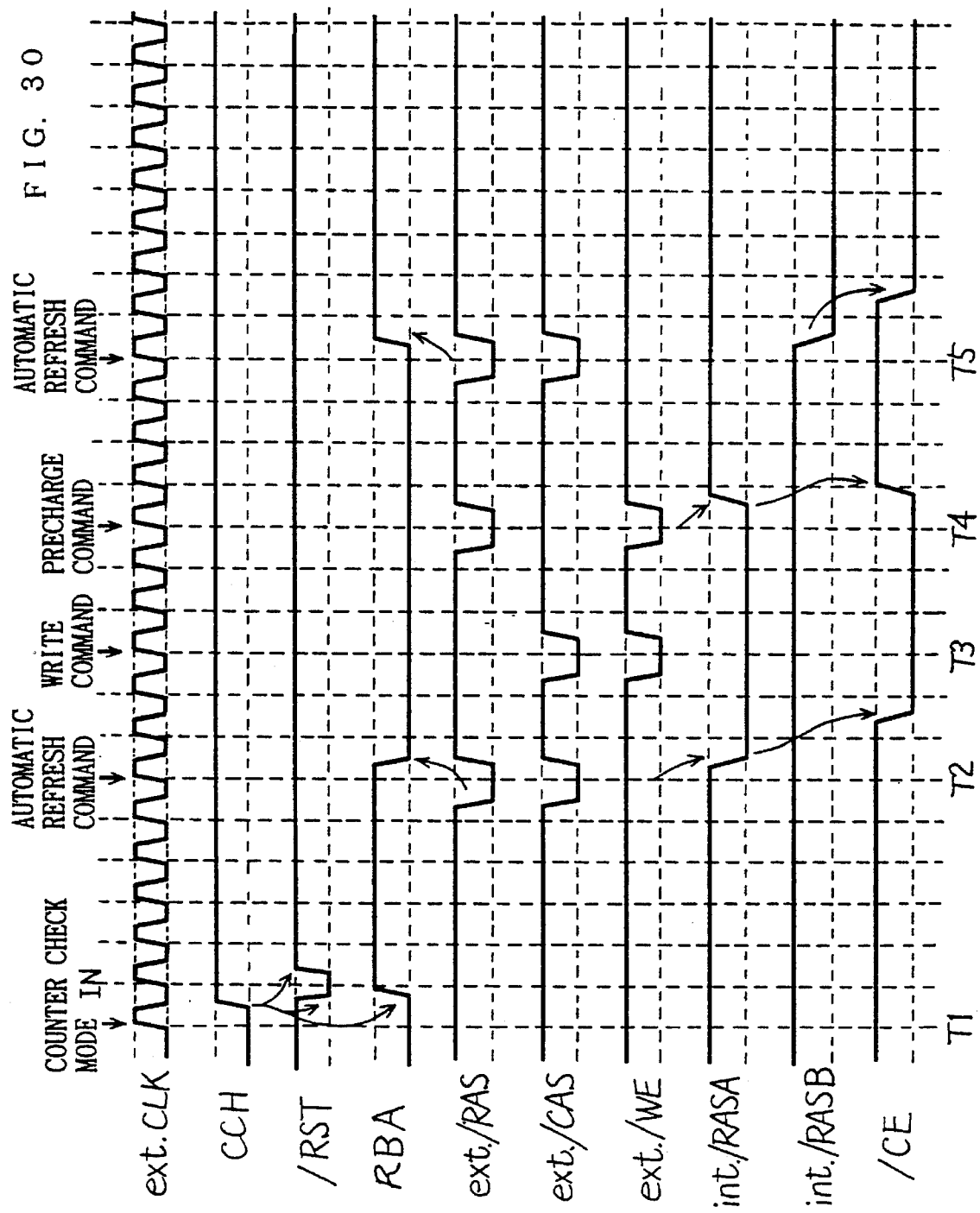

TEST CIRCUIT FOR REFRESH COUNTER OF CLOCK SYNCHRONOUS TYPE SEMICONDUCTOR MEMORY DEVICE

BACKGROUND OF THE INVENTION

1. Field of the Invention

The present invention relates to a synchronous semiconductor memory device which strobes external signals including an external control signal, an address signal, write data and the like in synchronization with a clock signal formed of a series of pulse trains, and more particularly, it relates to a structure for refreshing data which are held in memory cells. More specifically, the present invention relates to a structure for enabling testing of a refresh counter which generates refresh addresses for specifying memory cells to be refreshed.

2. Description of the Background Art

The operating speed of a microprocessor (MPU) has been increasingly faster in recent years. On the other hand, a dynamic random access memory (hereinafter referred to as DRAM) which is employed as a main memory cannot follow the MPU in operating speed although its operation has also been speeded up. Thus, it is frequently pointed out that access and cycle times of such a DRAM bottleneck the operation of the overall system, to deteriorate its performance.

In order to improve performance of such a system, frequently employed is a technique of arranging a high-speed memory called a cache memory, which is formed by a high-speed static random access memory (hereinafter referred to as SRAM) between a DRAM and an MPU. This high-speed cache memory is adapted to store frequently-used data, and to be accessed when the cache stores data required by the MPU. The DRAM is accessed only when the cache memory stores no data required by the MPU. Due to the high-speed cache memory storing frequently-used data, it is possible to extremely reduce frequency of access to the DRAM, thereby eliminating influences by the access and cycle times of the DRAM and improving performance of the system.

However, the SRAM is so high-priced as compared with the DRAM that the method employing a cache memory is unsuitable for a relatively low-priced device such as a personal computer. Thus, improvement has been looked for in performance of such a system with a low-priced DRAM.

JEDEC (Joint Electron Device Engineering Council) of the U.S.A. employs a synchronous DRAM (hereinafter referred to as SDRAM) which operates in synchronization with a clock signal as a main memory for a high-speed MPU, and is now in operation for standardizing the specification of the SDRAM. While the standard specification is not yet clarified in detail, the following structure is proposed at present:

(1) The SDRAM is synchronized with a clock signal having a cycle of 10 to 15 ns (nanoseconds).

(2) The first data is randomly accessed with 4 to 6 clocks after a row address signal is inputted. Thereafter data of continuous addresses can be accessed every clock.

(3) Circuits provided in a chip are pipeline-driven while serial input/output buffers are provided in a data input/output part to reduce an access time.

(4) A refresh operation is executed by supplying an automatic refresh command from the exterior.

However, the aforementioned structure is a mere proposal, and no means for implementing this structure is described specifically.

In the aforementioned standard specification, the refresh operation is executed along an automatic refresh command. In relation to such an automatic refresh operation, the following proposal is further made in the standard specification of JEDEC:

(1) The refresh operation is completed after a lapse of a prescribed time upon supply of an automatic refresh command, so that an array including the refreshed memory cells returns to a precharged state.

(2) When two banks are included, these banks are alternately refreshed.

No structure for such a refresh operation is defined in detail. While the refresh operation is automatically executed in the interior by a refresh command, a refresh address counter is required for generating refresh addresses for specifying memory cells to be refreshed, in order to carry out this refresh operation.

In order to periodically refresh memory cells for correctly holding data, such a refresh address counter must normally operate to successively generate refresh addresses. In order to guarantee a normal operation of the refresh address counter, i.e., periodic and cyclic generation of refresh addresses, a test mode is required for checking whether or not the refresh address counter normally operates. However, the standard specification of JEDEC defines no such functional test mode for the refresh address counter.

SUMMARY OF THE INVENTION

An object of the present invention is to provide a structure for refreshing an SDRAM.

Another object of the present invention is to provide a structure for testing the function of a refresh address counter for generating refresh addresses.

Still another object of the present invention is to provide a structure for carrying out a refresh operation with low power consumption.

A synchronous semiconductor memory device according to the present invention comprises refresh address generator for generating a refresh address specifying a memory cell to be refreshed, refresh circuitry for refreshing the memory cells which are specified by the refresh address generated by the refresh address generation means in response to a refresh command, first inactivation circuitry for inactivating the refresh circuitry after a lapse of a prescribed time in response to the refresh command, second inactivation circuitry for bringing the first inactivating circuitry into an inoperable state in response to a first operation mode command which is different from the refresh command, and third inactivation circuitry for inactivating the refresh circuitry in response to a second operation mode command.

In the synchronous semiconductor memory device according to the present invention, the third inactivation circuitry determines a refresh termination period when the first operation mode is specified. Thus, it is possible to set a refresh duration at a desired period, thereby writing/reading data by externally accessing the memory cell selected along the refresh address. Consequently, it is possible to verify whether or not the refresh address counter normally operates to successively generate correct refresh addresses.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 illustrates correspondence between external control signals for the SDRAM to which the present invention is applied and correspondingly implemented operation modes;

FIG. 30 is a timing chart for illustrating a refresh operation in the SDRAM according to the present invention.

DESCRIPTION OF THE PREFERRED EMBODIMENTS

[Functional Structure of SDRAM]

Figure 1:
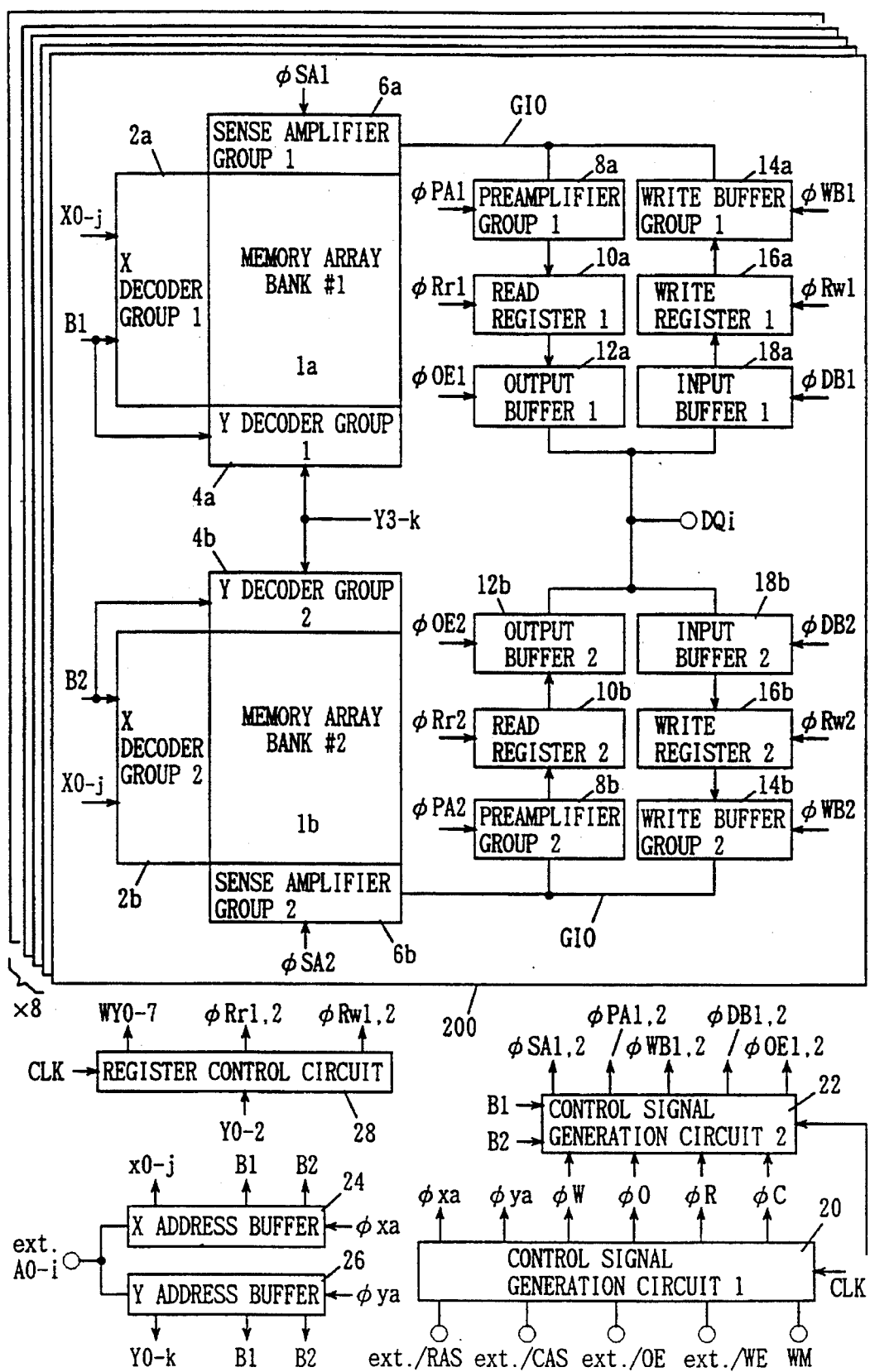
FIG. 1 is a block diagram functionally showing an overall structure of an SDRAM to which the present invention is applied.

FIG. 1 is a block diagram functionally showing a structure of an overall part in an SDRAM according to the present invention. FIG. 1 shows a structure of a functional block 200 which is related to 1-bit data input/output of the SDRAM having a by 8-bit structure. A circuit part which is related to a refresh operation is not clearly shown in FIG. 1. Refresh control circuits are included in control signal generation circuits 20 and 22 shown in FIG. 1, as hereinafter described in detail.

An array part which is related to a data input/output terminal DQi includes memory arrays 1a and 1b forming banks #1 and #2 respectively.

With respect to the memory array 1a forming the bank #1, there is provided an X decoder group 2a including a plurality of row decoders for decoding address signals X0 to Xj and selecting a corresponding row of the memory array 1a, a Y decoder group 4a including a plurality of column decoders for decoding column address signals Y3 to Yk and generating column selection signals and selecting corresponding columns of the memory array 1a, and a sense amplifier group 6a for detecting and amplifying data of memory cells which are connected to the selected row of the memory array 1a.

The X decoder group 2a includes the row decoders which are provided in correspondence to respective word lines of the memory array 1a. Row decoders are selected in accordance with the address signals X0 to Xi, so that the word lines provided for the selected row decoders are selected.

The Y decoder group 4a includes the column decoders which are provided for the respective column selection lines of the memory array 1a. A single column selection line brings eight pairs of bit lines into selected states, as described later. The X decoder group 2a and the Y decoder group 4a simultaneously bring 8-bit memory cells into selected states in the memory array 1a. The X decoder group 2a and the Y decoder group 4a are both activated by a bank specifying signal B1.

The bank #1 is further provided with a bus GIO as internal data transmission lines (global IO lines) for transmitting data which are detected and amplified by the sense amplifier group 6a and transmitting write data to selected memory cells of the memory array 1a. The global IO line bus GIO includes eight pairs of global IO lines for simultaneously transferring data to and from simultaneously selected 8-bit memory cells.

In order to read data, the bank #1 is provided with a preamplifier group 8a which is activated in response to a preamplifier activation signal φPA1 for amplifying data on the global IO line bus GIO, a read register 10a for storing data amplified in the preamplifier group 8a, and an output buffer 12a for successively outputting the data stored in the read register 10a.

Each of the preamplifier group 8a and the read register 10a has a structure of an 8-bit width in correspondence to the eight pairs of global IO lines. The read register 10a latches the data outputted from the preamplifier group 8a to successively output the same in response to a register activation signal φRr1.

The output buffer 12a transmits the 8-bit data successively outputted from the read register 10a to the data input/output terminal DQi in response to an output enable signal φOE1. Referring to FIG. 1, the data input/output terminal DQi is adapted to input and output the data. Alternatively, the data may be inputted and outputted through separate terminals.

In order to write data, on the other hand, the bank #1 is further provided with an input buffer 18a of a 1-bit width which is activated in response to an input buffer activation signal φDB1 for generating internal write data from input data supplied to the data input/output terminal DQi, a write register 16a which is activated in response to a register activation signal φRw1 for successively storing write data received from the input buffer 18a in accordance with wrap addresses, and a write buffer group 14a which is activated in response to a write buffer activation signal φWB1 for amplifying and transmitting the data stored in the write register 16a to the global IO line bus GIO.

Each of the write buffer group 14a and the write register 16a has an 8-bit width.

Similarly to the above, the bank #2 includes the memory array 1b, an X decoder group 2b, a Y decoder group 4b, a sense amplifier group 6b which is activated in response to a sense amplifier activation signal φSA2, a preamplifier group 8b which is activated in response to a preamplifier activation signal φPA2, a read register 10b which is activated in response to a register activation signal φRr2, an output buffer 12b which is activated in response to an output enable signal φOE2, a write buffer group 14b which is activated in response to a buffer activation signal φWB2, a write register 16b which is activated in response to a register activation signal φRw2, and an input buffer 18b which is activated in response to a buffer activation signal φDB2.

The banks #1 and #2 are identical in structure to each other. Due to the read registers 10a and 10b and the write registers 16a and 16b, it is possible to input/output data in synchronization with a high-speed clock signal through the single data input/output terminal DQi.

As to control signals for the banks #1 and #2, only those for either bank are generated in accordance with a bank specifying signal B1 or B2.

The functional block 200 shown in FIG. 1 is provided for each data input/output terminal. The SDRAM of the 8-bit structure includes eight such functional blocks 200.

Since the banks #1 and #2 are substantially identical in structure to each other, it is possible to drive the banks #1 and #2 substantially independently of each other by activating only one of these banks by the bank specifying signal B1 or B2.

Further, the banks #1 and #2 are respectively provided with the data read registers 10a and 10b and the data write registers 16a and 16b independently of each other, whereby it is possible to correctly read and write data with no collision in switching between data read and write operation modes as well as in switching between the banks #1 and #2.

The first and second control signal generation circuits 20 and 22 are provided as control systems for independently driving the banks #1 and #2 respectively.

The first control signal generation circuit 20 takes in externally supplied control signals, i.e., an external row address strobe signal ext./RAS, an external column address strobe signal ext./CAS, an external output enable signal ext./OE, an external write enable signal ext./WE and a mask command signal WM in synchronization with an external clock signal CLK which is a system clock, for example, to generate internal control signals φxa, φya, φW, φO, φR and φC.

The second control signal generation circuit 22 generates control signals for independently driving the banks #1 and #2 respectively, i.e., the sense amplifier activation signals φSA1 and φSA2, the preamplifier activation signals φPA1 and φPA2, the write buffer activation signals φWB1 and φWB2, the input buffer activation signals φDB1 and φDB2, and the output buffer activation signals φOE1 and φOE2 in response to the bank specifying signals B1 and B2, the internal control signals φW, φO, φR and φC and the clock signal CLK.

Referring to FIG. 1, the second control signal generation circuit 22 is shown generating only the sense amplifier activation signals φSA1 and φSA2 as control signals for activating the memory arrays 1a and 1b. This circuit 22 also generates word line driving signals, which are transmitted onto corresponding selected word lines through the X decoder groups 2a and 2b.

The internal control signal φW is an internal write enable signal which is generated in response to the external write enable signal ext./WE. The internal control signal φO is an internal read enable signal which is generated in response to the external read enable signal ext./OE. The internal control signal φR is an internal row address strobe signal (internal RAS signal) which is generated in response to the external row address strobe signal ext./RAS.

The internal control signal φC is an internal column address strobe signal (internal CAS signal) which is generated in response to the external column address strobe signal ext./CAS. The internal control signals φxa and φya are internal address buffer activation signals which are generated in response to the external control signals ext./RAS and ext./CAS respectively.

The second control signal generation circuit 22 brings only control signals corresponding to the bank #1 or #2 which is specified by the bank specifying signal B1 or B2. The timing of each control signal is controlled by the clock signal CLK. For example, the output buffer activation signal φOE1 or φOE2 is generated when the clock signal CLK is counted six times after the external row address strobe signal ext./RAS (or the internal row address strobe signal φR) enters an active state.

The write buffer activation signal φWB1 or φwb2 is generated in response to the clock signal CLK after supply of eight write data, when a wrap length is set at 8. Namely, write data are transmitted to selected memory cells of the memory array 1a or 1b when the clock signal CLK is counted eight times after the external write enable signal ext./WE enters an active state on the assumption of the wrap length of 8. The SDRAM regularly operates on the assumption of a wrap length of 8 in a normal operation mode. The wrap length indicates the number of write or read data which are continuously supplied to a single data input/output terminal in a single active cycle (word line selection).

The SDRAM further includes an X address buffer 24 which takes in external address signals ext./A0 to ext./Ai in response to the internal control signal φxa to generate internal address signals x0 to xj and the bank selection signals B1 and B2, a Y address buffer 26 which is activated in response to the internal control signal φya for generating column selection signals Y3 to Yk for specifying column selection lines and wrap address bits Y0 to Y2 for specifying a first bit line pair (column) in a continuous access operation, and a register control circuit 28 which generates the register driving signals φRr1 and φRr2 for controlling the read registers 10a and 10b and the control signals φRw1 and φRw2 for driving the write registers 16a and 16b as peripheral circuits.

The register control circuit 28 is supplied with the bank specifying signal B1 or B2, to generate the register driving signal φRr1 or φRr2 for only the selected bank #1 or #2.

[Chip Layout]

Figure 2:
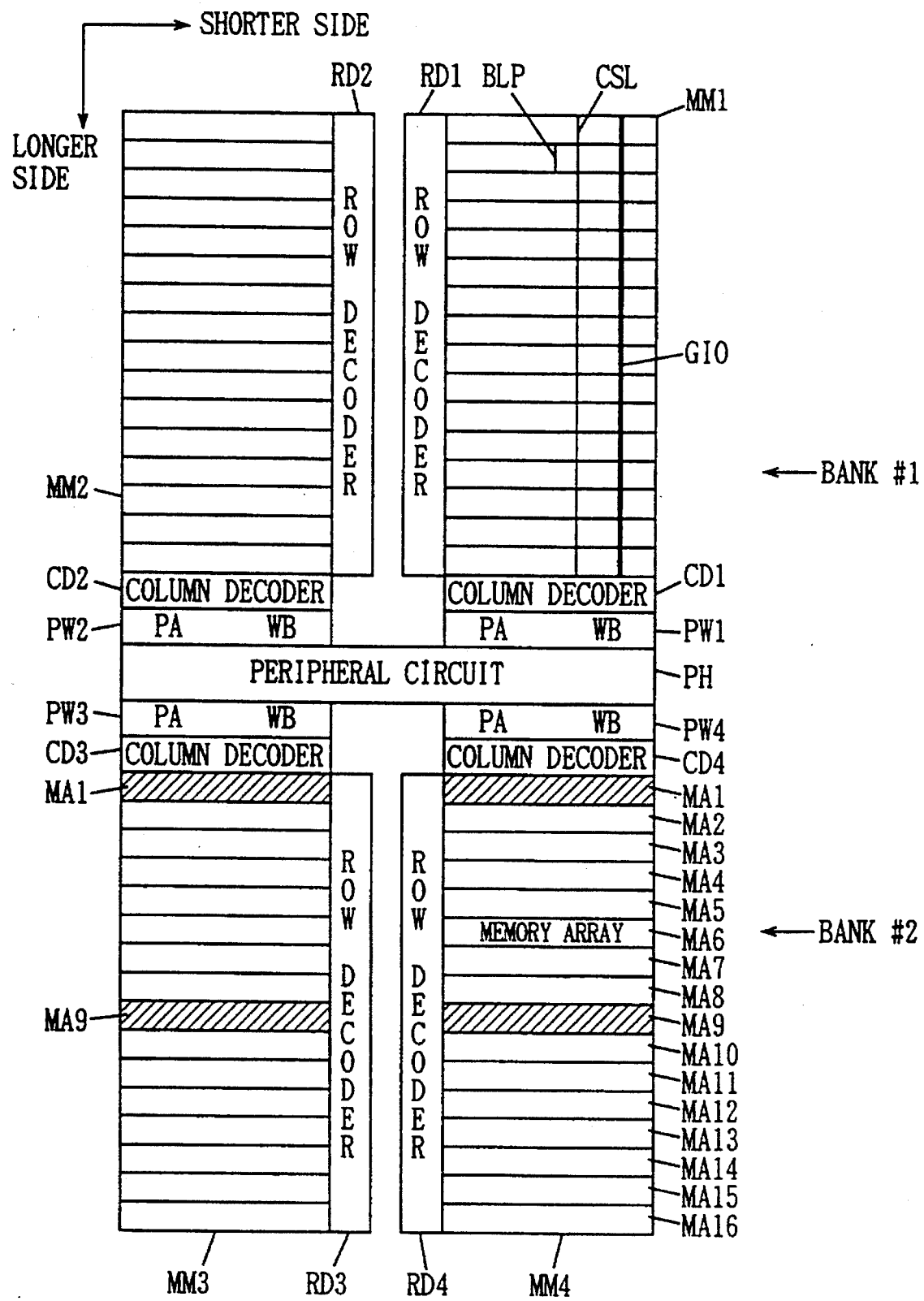
FIG. 2 illustrates a chip layout of the SDRAM to which the present invention is applied.

FIG. 2 illustrates a chip layout of the SDRAM according to the present invention. This figure shows a chip layout of a 16-megabit SDRAM having a 2M word by 8 bit structure.

SDRAM includes four memory mats MM1 to MM4, each having 4-megabit storage capacity. Each of the memory mats MM1 to MM4 includes 16 memory arrays MA1 to MA16 each having 256-k bit storage capacity.

Row decoders RD1 to RD4 are arranged on respective one sides of the memory mats MM1 to MM4 along chip longer sides respectively. Further, column decoders CD1 to CD4 are arranged on chip center sides of the memory mats MM1 to MM4 along shorter sides respectively. Outputs of the column decoder CD (symbol CD is adapted to genericly indicate the column decoders CD1 to CD4) are provided onto column selection lines CSL extending across the respective arrays of the corresponding memory mat MM (symbol MM genericly indicates the memory mats MM1 to MM4). Each column selection line CSL simultaneously brings eight pairs of bit lines into selected states.

Global IO line pairs GIO for transmitting internal data are arranged across the respective arrays along the longer sides of the memory mats MM1 to MM4 respectively.

The respective memory mats MM1 to MM4 are further provided on the chip center sides thereof with input/output circuits PW1 to PW4, which are formed by preamplifiers PA for amplifying data read from selected memory cells and write buffers WB for transmitting write data to the selected memory cells respectively.

Peripheral circuit PH for generating address and control signals are arranged on the chip central portion.

The SDRAM shown in FIG. 2 comprises the two banks #1 and #2 which can carry out precharge operations and activating operations (word line selecting, sense and column selecting operations) independently of each other as shown in FIG. 1. The bank #1 includes the memory mats MM1 and MM2, while the bank #2 includes the memory mats MM3 and MM4. The number of the banks #1 and #2 is changeable.

Each of the memory mats MM1 to MM4 comprises two array blocks each having 2-megabit storage capacity. One of the array blocks is formed by the memory arrays MA1 to MA8, while the other array block is formed by the memory arrays MA9 to MA16. A single memory array is selected at the maximum in each array block.

Four memory arrays are simultaneously activated, such that the memory arrays MA1 and MA9 of the memory mats MM3 and MM4 are activated in FIG. 2 respectively. In other words, a single memory array is selected from each array block of each memory mat in the selected bank #1 or #2.

On the other hand, eight column selection lines CSL are simultaneously selected. Each column selection line CSL selects eight pairs of bit lines. Thus, 8×8=64 bit memory cells are selected at one time.

The input/output circuits PW are employed in common for the respective memory arrays of the corresponding memory mats MM. Each input/output circuit PW includes 32 preamplifier PA and 32 write buffers WB. Namely, the overall SDRAM includes 32×4=128 preamplifiers PA and 128 write buffers WB.

The preamplifiers PA and the write buffers WB (input/output circuits PW) which are concentratedly arranged on the chip central portion are driven by control circuits included in the peripheral circuits PH. Thus, signal lines for controlling operations of the preamplifiers PA and the write buffers WB are reduced in length, whereby loads on the signal lines can be reduced to implement a high-speed operation.

Since the peripheral circuits PH are concentratedly arranged on the chip central portion, data are inputted/outputted through the chip central portion, whereby the data input/output terminals are arranged on a package central portion as to pin arrangement in packaging. Therefore, distances between the peripheral circuits PH and the data input/output terminals are reduced to enable high-speed input/output of data.

Figure 3:
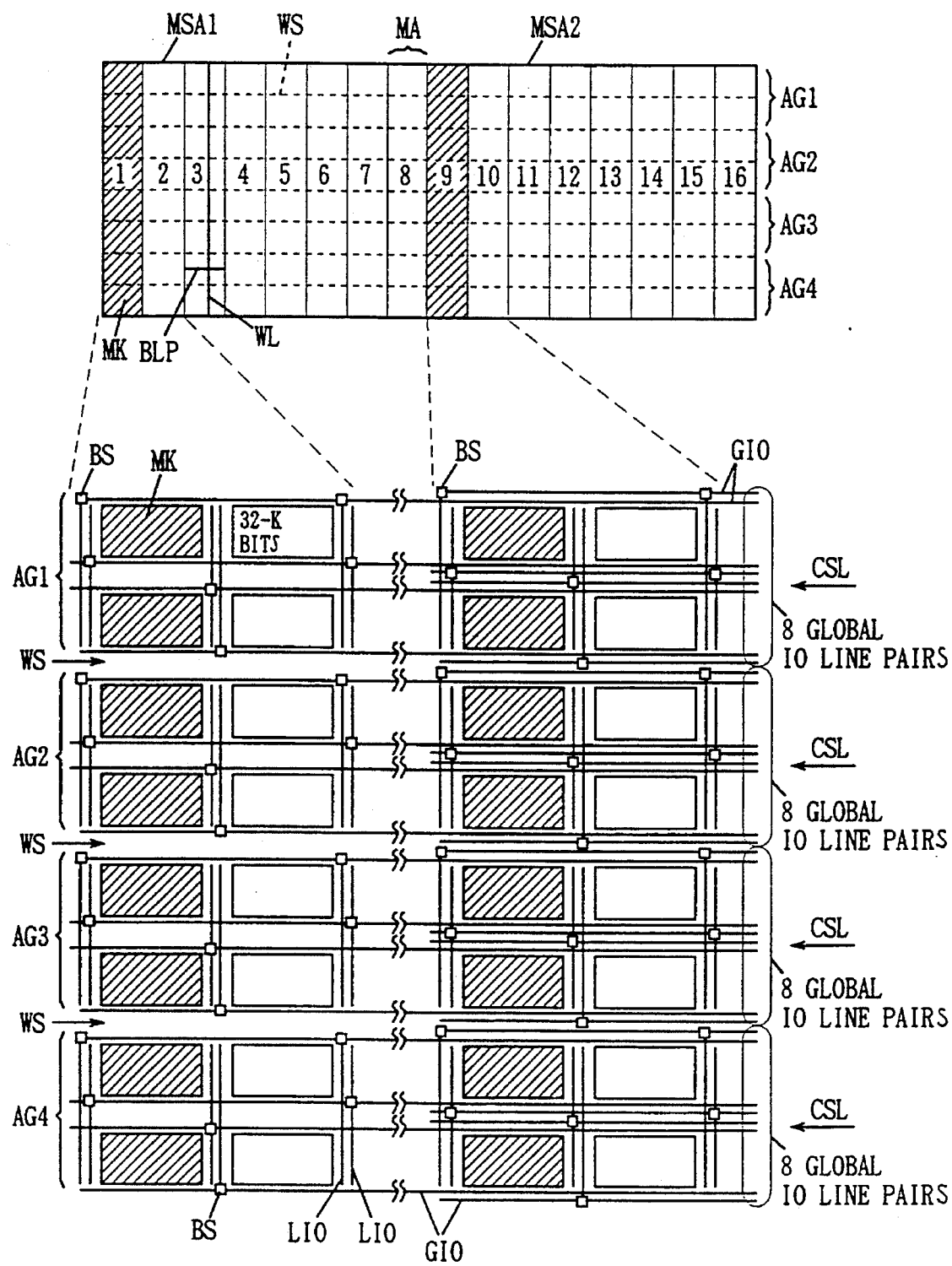
FIG. 3 illustrates arrangement of a memory array of the SDRAM to which the present invention is applied.

FIG. 3 illustrates arrangement of IO lines in the SDRAM shown in FIG. 2. This figure shows two 2-megabit memory arrays MSA1 and MSA2. The 2-megabit memory array MSA1 is a 2-megabit array block which is arranged in a position separated from the chip central portion, while the other memory array MSA2 is a 2-megabit array block which is close to the chip central portion.

Each of the 2-megabit memory arrays MSA1 and MSA2 includes 64 32-k bit memory arrays MK arranged in 8 rows and 8 columns. Each 2-megabit memory array MSA (this symbol genericly indicates the memory arrays MSA1 and MSA2) is divided into four array groups AG1, AG2, AG3 and AG4 along extending directions of word lines WL. Word line shunt regions WS are provided between the 32-k bit memory arrays MK which are adjacent to each other along the word lines WL. In an ordinary DRAM, low-resistance metal wires of aluminum or the like are arranged in parallel with word lines WL of polysilicon, and the former are electrically connected with the latter at prescribed intervals in order to reduce resistances of the word lines WL. Regions for connecting the polysilicon word lines and the low-resistance metal wires are called word line shunt regions. No bit lines, i.e., no memory cells are present in the word line shunt regions WS, since it is necessary to connect the polysilicon word lines which are present under bit lines BL with low-resistance metal wire layers which are present above the bit lines BL.

In the 2-megabit memory array MSA2 which is close to the chip central portion, each word line shunt region WS is provided with four global IO line pairs. Two of the four pairs of global IO lines further extend toward the 2-megabit memory array MSA1 which is remote from the chip central portion. Namely, two global IO line pairs GIO are arranged on each word line shunt region of the 2-megabit memory array MSA1 which is remote from the chip central portion. The two global IO line pairs GIO are used by a single 2-megabit memory array MS.

Local IO line pairs LIO are provided in order to connect the global IO line pairs IGO with a selected memory array. These local IO line pairs LIO are provided for the respective array blocks MK in the respective array groups AG1, AG2, AG3 and AG4.

Four local IO line pairs LIO are arranged for each 32-k bit memory array MK so that two pairs are arranged on one side and the remaining two pairs are arranged on the other side. These local IO line pairs LIO are shared by the 32-k bit memory arrays MK belonging to the same array group, which are adjacent along the word lines WL, as well as the 32-k bit memory arrays MK which are adjacent along the bit lines BL.

The memory arrays MK have alternately arranged shared type sense amplifier structures, as hereinafter described. A sense amplifier is arranged in each region between each pair of 32-k bit memory arrays MK which are adjacent to each other along the bit lines BL. Block selecting switches BS are arranged in order to connect the global IO line pairs GIO with the local IO line pairs LIO. These block selecting switches BS are arranged on intersection points between the word line shunt regions WS and the sense amplifiers band.

As to the column selection lines CSL for transmitting column selection signals from the column decoders CD, a single line is brought into a selected state in each of the array groups AG1 to AG4. The single column selection lines CSL select four bit line pairs BLPs to connect the same to corresponding local IO line pairs LIO in the 2-megabit memory array MSA1 which is far from the chip central portion, while selecting four bit line pairs BLP to connect the same to corresponding local IO line pairs LIO in the 2-megabit memory array MSA2 which is close to the chip central portion.

Namely, the single column selection lines CSL select eight bit line pairs BLPs, to connect the same to eight global IO line pairs GIO through the local IO line pairs LIO. Two memory mats MM are selected and 8×4=32 bit line pairs BLPs are selected in each memory mat MM, whereby 64 bit line pairs BLPs are selected in total so that 64-bit memory cells are simultaneously accessible in total.

[Arrangement of Memory Cell]

Figure 4:
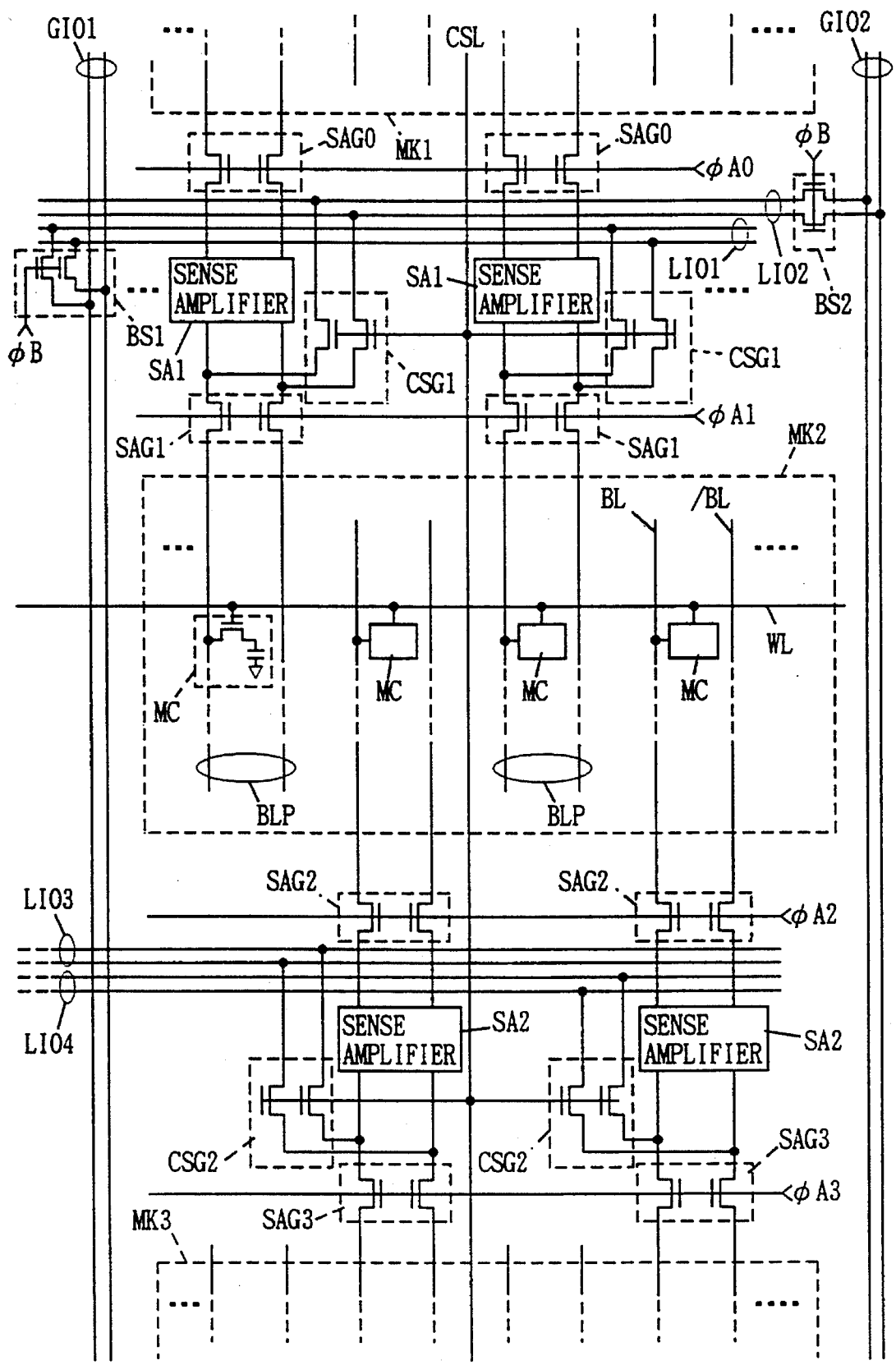
FIG. 4 illustrates the structure of the array of the SDRAM to which the present invention is applied.

FIG. 4 illustrates a structure which is related to a single 32-k bit memory array MK2. Referring to FIG. 4, the 32-k bit memory array MK2 includes a word line WL which receives a row selecting signal from the row decoder RD, bit line pairs BLP which are arranged in a direction intersecting with the word line WL, and dynamic memory cells MC which are arranged in correspondence to intersections between the word line WL and the bit line pairs BLP.

Each memory cell MC includes an access transistor and a capacitor for storing information. Each bit line pair BLP includes bit lines BL and /BL which receive complementary signals. Referring to FIG. 4, the memory cells MC are arranged in correspondence to intersections between the bit lines BL and the word line WL.

Array selector gates SAG1 and SAG2 are arranged on both sides of the memory array MK2. These array selector gates SAG1 and SAG2 are alternately arranged with respect to the bit line pairs BLP. The array selector gates SAG1 enter a conducting state in response to an array selection signal $\phi A1$, while the array selector gates SAG2 enter a conducting state in response to an array selection signal $\phi A2$.

The bit line pairs BLP are connected to sense amplifiers SA1 and SA2 through the array selector gates SAG1 and SAG2 respectively. The sense amplifiers SA1 are arranged on one side of the memory array MK2 in parallel with the word line WL, while the other sense amplifiers SA2 are arranged on the other side of the memory array MK2 in parallel with the word line WL. These sense amplifiers SA1 and SA2 are alternately arranged with respect to the bit line pairs BLP of the memory array MK2. The sense amplifiers SA1 are shared by another memory array MK1 and the memory array MK2, while the sense amplifiers SA2 are shared by the memory array MK2 and still another memory array MK3.

Local IO line pairs LIO1 and LIO2 are arranged in parallel with the columns of the sense amplifiers SA1. On the other hand, local IO line pairs LIO3 and LIO4 are arranged in parallel with the band of the sense amplifiers SA2. Referring to FIG. 4, two local IO line pairs are provided on either side of the sense amplifiers SA. Alternatively, the local IO line pairs may be arranged on both sides of the sense amplifiers SA.

With respect to the sense amplifiers SA1, column selector gates GSG1 are provided for transmitting data which are detected and amplified by the sense amplifiers SA1 to the local IO line pairs LIO1 and LIO2. With respect to the sense amplifiers SA2, column selector gates CSG2 are similarly provided for transmitting data which are detected and amplified by the sense amplifiers SA2 to the local IO line pairs LIO3 and LIO4.

The column selection line CSL which receives the signal from the column decoder CD simultaneously brings the two column selector gates CSG1 and the two column selector gates CSG2 into a conducting state. Thus, four bit line pairs BLP are simultaneously connected to the local IO line pairs LIO1, LIO2, LIO3 and LIO4. The data which are detected and amplified by the sense amplifiers SA1 are transmitted to the local IO line pairs LIO1 and LIO2. On the other hand, the data which are detected and amplified by the sense amplifiers SA2 are transmitted to the local IO line pairs LIO3 and LIO4.

The block selecting switches BS which conduct in response to block selection signals $\phi B$ are provided between the local IO line pairs LIO and the global IO line pairs GIO. FIG. 4 shows block selecting switches BS1 and BS2 for connecting the local IO line pairs LIO1 and LIO2 to the global IO line pairs GIO1 and GIO2 respectively.

As shown in FIG. 3, the local IO line pairs LIO3 and LIO4 are connected to two adjacent global IO line pairs GIO through the block selecting switches BS respectively (this connection is not shown in FIG. 4).

The operation is now briefly stated. When the memory array MK2 includes a selected word line WL, the array selection signals $\phi A1$ and $\phi A2$ enter active states so that the bit line pairs BLP included in the memory array MK2 are connected to the sense amplifiers SA1 and SA2. Array selector gates SAG0 and SAG3 which are provided for the memory arrays MK1 and MK3 enter nonconducting states. The memory arrays MK1 and MK3 maintain precharged states.

In the memory array MK2, memory cell data appear on the respective bit line pairs BLP, and thereafter the sense amplifiers SA1 and SA2 are activated to detect and amplify the memory cell data.

Then, the signal on the column selection line CSL rises to a high level to enter an active state, whereby the column selector gates CSG1 and CSG2 conduct so that the data which are detected and amplified by the sense amplifiers SA1 and SA2 are transmitted to the local IO line pairs LIO1 to LIO4.

Subsequently or simultaneously the block selection signals φB enter high-level active states, so that the local IO line pairs LIO1 to LIO4 are connected to the global IO line pairs GIO1 to GIO4. In data reading, the data of the global IO line pairs GIO1 to GIO4 are amplified through the preamplifiers PA, to be stored in the read register 10a or 10b and thereafter successively outputted. In data writing, on the other hand, write data which are supplied from the write buffers WB are transmitted to the selected bit line pairs BLP through the global IO line pairs GIO and the local IO line pairs LIO, so that the data are written in the memory cells MC.

The block selection signals φB enter active states only for the memory array MK2 including the selected word line WL. This also applies to the array selection signals φA1 and φA2. The block selection signals φB and the array selection signals φA1 and φA2 can be generated through a prescribed number of bits (four bits, for example) of row address signals.

[Specification of Operation Mode]

The operation mode of the SDRAM is decided by states of the external control signals on a leading edge of the clock signal CLK. The external control signals are supplied only in a cycle of specifying the operation mode in the form of pulses. All control signals, address signals and write data are taken in on a leading edge of the clock signal CLK. An operation mode which is specified in the interior of the device is determined along combination of the states of the external control signals on a leading edge of the clock signal CLK, to carry out operation control corresponding to the specified operation mode in accordance with the result of the determination.

FIG. 5 illustrates correspondence between states of the internal control signals and operation modes as specified. Referring to FIG. 5, a data input/output/mask signal DQM corresponds to combination of the external output enable signal ext./OE and the write mask signal WM shown in FIG. 1. A chip selection signal /CS is additionally provided in order to bring the SDRAM into a selected state. The SDRAM enters an operable state when the chip selection signal /CS enters a low-level active state. The correspondence between the external control signals and the operation modes is now described with reference to FIG. 5.

(a) /CS=/RAS="L" and/CAS=/WE="H"

This state is called an active command, which is adapted to specify incorporation of a row address and activation of an array. In other words, a row address is taken in together with a bank address, so that an operation related to row selection is executed in a selected bank.

(b) /CS=/CAS="L" and/RAS=/WE="H"

This state is called a read command, which is adapted to specify incorporation of a column address and a data read operation mode. In this operation mode, a bank address is also taken in together with the column address and a read data register corresponding to a selected bank is so selected that data are transferred from the selected memory cells to the read data register in the selected bank.

(c) /CS=/CAS=/WE="L" and/RAS="H"

This combination of the external control signals is called a write command, which is adapted to specify incorporation of a column address and a data write operation. In this operation mode, the write register 16a or 16b is activated in a selected bank so that supplied data are written in the write register 16a or 16b and selected memory cells.

(d) /CS=/RAS=/WE="L" and/CAS="H"

This combination of the external control signals is called a precharge command, which is adapted to bring the arrays into precharged states.

(e) /CS=/RAS=/CAS="L" and/WE="H"

This combination of the external control signals is called an automatic refresh command, which is adapted to specify an automatic refresh operation so that a refresh address is internally generated by a built-in address counter and a refresh operation for memory cells in a row selected in accordance with the refresh address is executed. In this refresh operation, the memory cells automatically return to precharged states after a lapse of a certain prescribed time.

(f) /CS=/RAS=/CAS=/WE="L"

In this operation mode, data are set in a mode register. This mode register is adapted to specify an operation mode which is specific to the SDRAM, so that a desired operation is executed in accordance with the data set in the mode register. Such a mode register is employed for setting a wrap length indicating the number of continuously accessed data bits, for example.

(g) DQM="L"

Data are written or read in an operation mode which is decided by the signals/CAS and/WE. In other words, externally supplied write data are stored in the write register 16a or 16b or data stored in a read data register are read out.

(h) DQM="H"

In this operation mode, data reading is brought into an inactive state and a write mask operation (mask operation in continuous bit data (wrap data)) is specified. Masking with respect to write data is carried out on data which are supplied on a leading edge of a next clock signal CLK after the signal DQM goes high.

(i) /CS="L" and/RAS=/CAS=/WE="H"

No operation change is caused in this state. No operation mode is specified. The SDRAM is in a selected state and in execution of a previously specified operation.

(j)/CS="H"

In this state, the SDRAM is in a non-selected state, and the signals /RAS, /CAS and /WE are ignored.

Referring to FIG. 5, signs "-" indicate "don't care" states, and symbols X indicate "arbitrary" states.

[Specific Operation Sequence]

Figure 6:
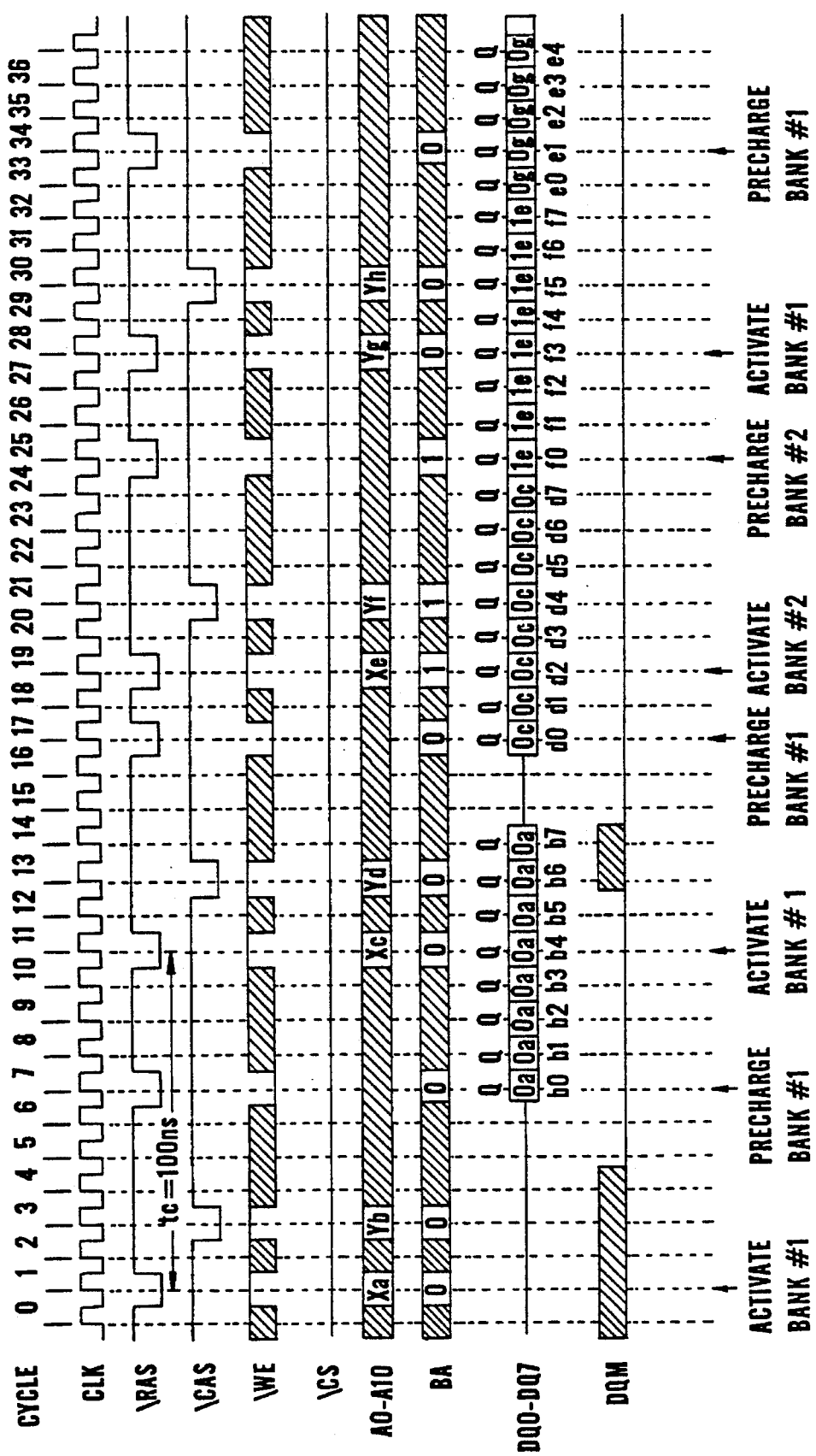
FIG. 6 illustrates an exemplary operation sequence of the SDRAM to which the present invention is applied.

FIG. 6 is a timing chart showing states of the external signals in data reading of the SDRAM. A data read operation is now briefly described with reference to FIG. 6.

In a cycle 1, the signal /RAS is set at a low level and the signals /CAS and /WE are set at high levels on a leading edge of the clock signal CLK, so that an "active command" is supplied. At this time, row address signal bits A0 to A10 are taken in as a row address signal Xa, to generate an internal address. At the same time, a bank address signal BA is also taken in to generate the bank specifying signal B1 or B2. In the following description, it is assumed that the bank #1 is specified when the bank address BA is "0" while the bank #2 is specified when the same is "1".

In the bank #1, a row decoder operation and array activation are executed.

In a clock cycle 3, the signals /RAS and /WE are set at high levels and the signal /CS is set at a low level on a leading edge of the clock signal CLK, so that a "read command" is supplied. Data reading is specified, while the address signal bits A0 to A10 are incorporated as a column address signal Yb on the leading edge of the clock signal CLK in the cycle 3. At this time, a bank address BA is also supplied. This bank address BA is "0", which indicates the bank #1. In the interior, row and column selecting operations are executed along the row and column address signals Xa and Yb with respect to the bank #1, so that data of the selected memory cells are stored in the read data register (read register 10a). The data are read in a cycle 7. In this case, the signal DQM is previously set at a low level. This low-level signal DQM enables data reading to the exterior of the device.

From the cycle 7 to a cycle 14, eight data which are stored in the read register 10a are successively read in synchronization with leading edges of the clock signal CLK. Continuous 8-bit data are indicated as b0 to b7. There are 8-bit data input/output terminals DQ0 to DQ7, and single data b is byte data.

In parallel with the data reading, the signals /RAS and /WE are set at low levels and the signal /CAS is set at a high level on the leading edge of the clock signal CLK in the cycle 7. At this time, the bank address signal BA is also set at "0". Thus, precharging of the bank #1 is specified so that the array of the bank #1 is precharged.

The bank #1 entering the precharged state can be re-activated after a lapse of a prescribed RAS precharge period (2 to 3 clock cycles).

In the cycle 11, the signal /RAS goes low and the signals /CAS and /WE go high on the leading edge of the clock signal CLK. The bank address signal BA is still at "0". The bank #1 is re-activated, so that a row selecting operation is started in accordance with a currently received row address signal Xc.

In the cycle 13, the signal /CAS is set at a low level and the signals /RAS and /WE are set at high levels on the leading edge of the clock signal CLK. A column address signal Yd as well as the bank address signal BA are taken in while a data read operation is specified.

In the bank #1, row and column selecting operations are executed in accordance with the row and column addresses Xc and Yd, so that data of the selected memory cells are again transferred to the read register 10a. The data are outputted to the exterior of the device after six clocks are counted from starting of a memory cycle in which the signal /RAS enters a low state. In this state, the signal DQM is already at a low level, to indicate an output enable state.

From a cycle 17, eight data d0 to d7 selected by the addresses Xc and Yd are successively read in response to leading edges of the clock signal CLK. At the same time, the signals /RAS and /WE as well as the bank address signal BA are brought into "0" states in the cycle 17. Thus, the bank #1 again enters a precharged state.

In a cycle 19, the signal /RAS is set to a low level and the signals /CAS and /WE are set to high levels, while the bank address signal BA is set at "1". In response to this active command, the bank #2 is selected so that currently supplied address signal bits A0 to A10 are taken in as a row address Xe. Thereafter a row selecting operation along the row address Xe is executed in the bank #2.

The signals /RAS and /WE are set at high levels and the signal /CAS is set at a low level on a leading edge of the clock signal CLK in a cycle 21. Thus, a read command for the bank #2 is supplied to specify a data read operation. At the same time, a column address Yf is taken in with the bank address signal BA.

The signal DQM is in a low-level state, to indicate an output enable state. After the data d7 is read from the bank #1, data f0 from the bank #2 is read on a leading edge of the clock signal CLK in a next clock cycle 25. At this time, the signals /RAS and /WE are set at low levels and the signal /CAS is set at a high level, while the bank address signal BA is "1", and precharging of the bank #2 is specified. The data register 10b for reading data subsequently outputs data read from the bank #2. At this time, precharging is executed in the bank #2.

In a cycle 28, the signal /RAS is again set at a low level and the signals /CAS and /WE are set at high levels while the bank address signal BA is set at "0", thereby re-activating the bank #1.

In a cycle 30, a column address Yh is taken in with respect to the bank #1, so that the bank #1 is precharged in a cycle 34.

As hereinabove described, the signal /RAS is applied in a pulse form and the control signals /RAS, /CAS and /WE are combined in a prescribed state only in the first period of each operation cycle to specify the operation mode, whereby the banks #1 and #2 can be easily switched. Further, it is possible to precharge the bank #2 during activation of the bank #1. Thus, it is possible to continuously read data alternately from the banks #1 and #2 with no requirement for consideration of an RAS precharge time, thereby reading data at a high speed.

[Data Writing]

Figure 7:
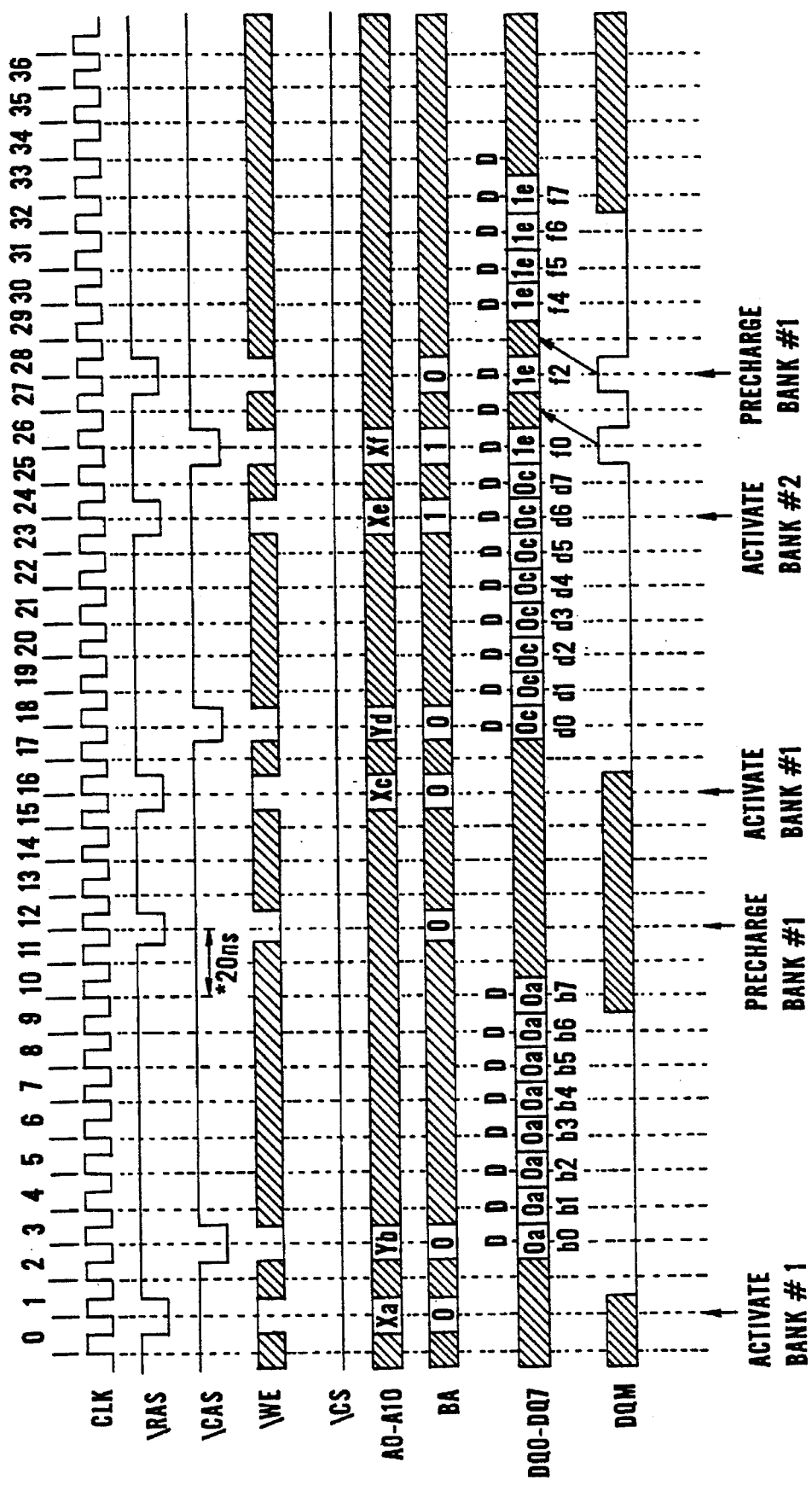
FIG. 7 is a timing chart showing the operation sequence of the SDRAM to which the present invention is applied.

FIG. 7 is a timing chart showing an exemplary SDRAM data write operation sequence. A wright command for specifying a write operation is obtained by setting the signal /RAS at a high level while setting the signals /CAS and /WE at low levels on a leading edge of the clock signal CLK. In the operation sequence shown in FIG. 7, a data write operation with respect to the bank #1 is first specified.

When this write command is supplied, data writing in the write register 16a, i.e., incorporation of internal data is executed simultaneously with the setting of the signals /CAS and /WE at low levels. Namely, the data are taken into the input buffer 18a simultaneously with write instruction in data writing. At this time, the state of the write register 16a may not yet be completely reset. The state of the register 16a has only to be ascertained in advance of a next clock cycle, to enable writing of the data b0.

When the signal DQM is set at a high level, write data which is supplied in the next clock cycle is masked. The operation sequence in data writing shown in FIG. 7 is similar to that of the data write operation shown in FIG. 6 except the aforementioned point, and hence the description thereof is not repeated. The bank #1 or #2 is specified in accordance with the bank address signal BA, so that the data are written in the memory cells of the as-selected bank #1 or #2 through the write register 16a or 16b.

[Refresh Operation]

Figure 8:
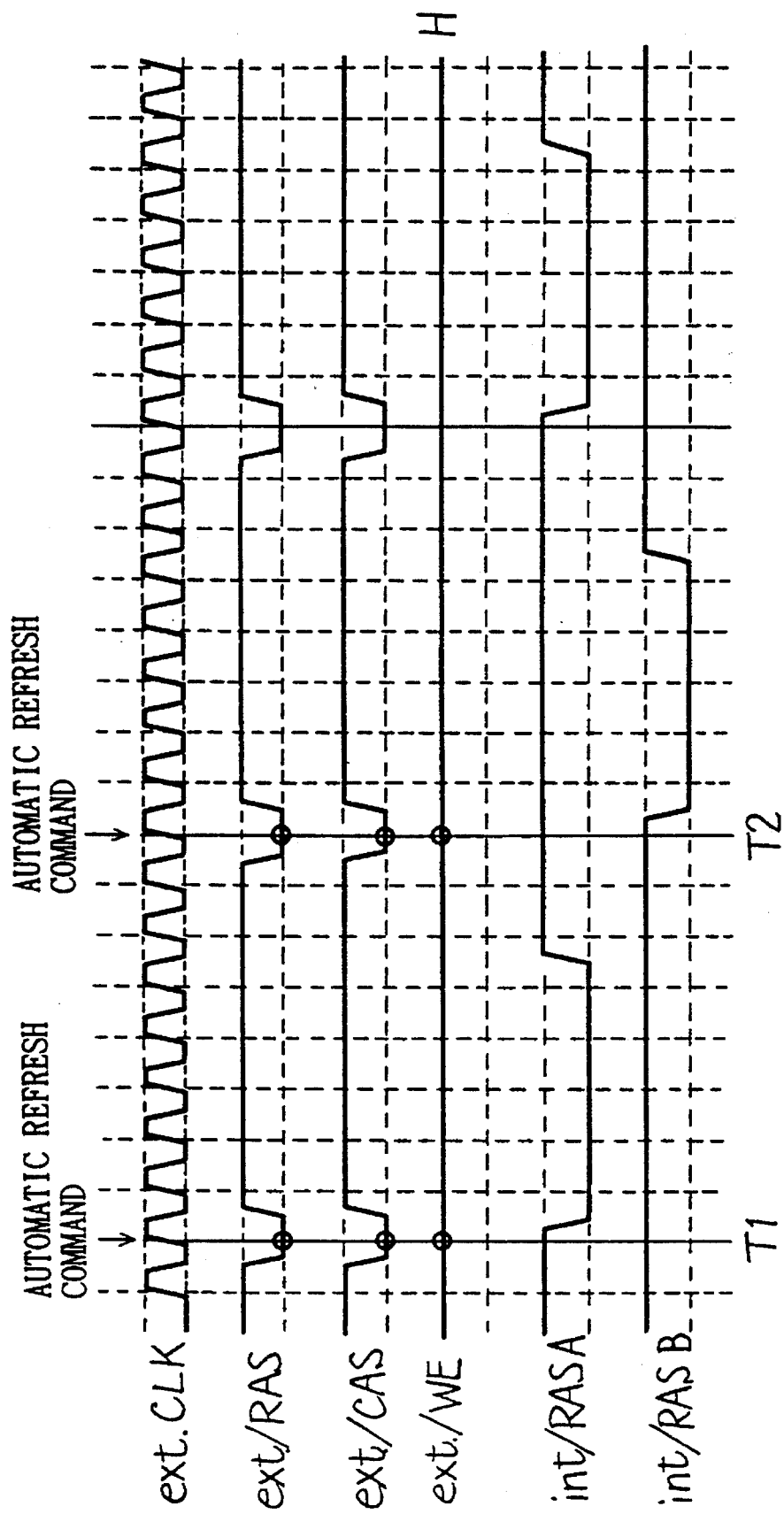
FIG. 8 is a timing chart for illustrating an automatic refresh operation of the SDRAM having a bank structure.

FIG. 8 illustrates states of the external and internal control signals in a refresh operation. The refresh operation is now briefly described.

A refresh command is supplied by setting the external control signals ext./RAS and ext./CAS at low levels while setting the external control signal ext./WE at a high level on a leading edge of the external clock signal ext./CLK. While the signal /CS is brought into a low-level active state, this is not illustrated in particular since the control signal /CS for the SDRAM is regularly set at a low level when accessed. In response to the refresh command, the SDRAM automatically generates an internal RAS signal in its interior, to execute a refresh operation with respect to one of the banks #1 and #2. Referring to FIG. 8, an internal RAS signal int./RASA is generated for the bank #1. In this refresh operation, completion of the refresh operation is automatically specified in the interior after a lapse of a prescribed time, so that the array returns to a precharged state.

After the refresh command is supplied at a time T1, a subsequent refresh command is supplied at a time T2 so that the SDRAM again executes a refresh operation. At this time, the refresh operation is executed on the bank #2 which is different from the bank #1 refreshed previously. The built-in address counter generates a bank address. Thereafter the SDRAM successively switches the banks #1 and #2 and executes refresh operations in its interior according to respective supplies of refresh commands. Such a refresh mode is now described as an automatic refresh mode.

Figure 9:
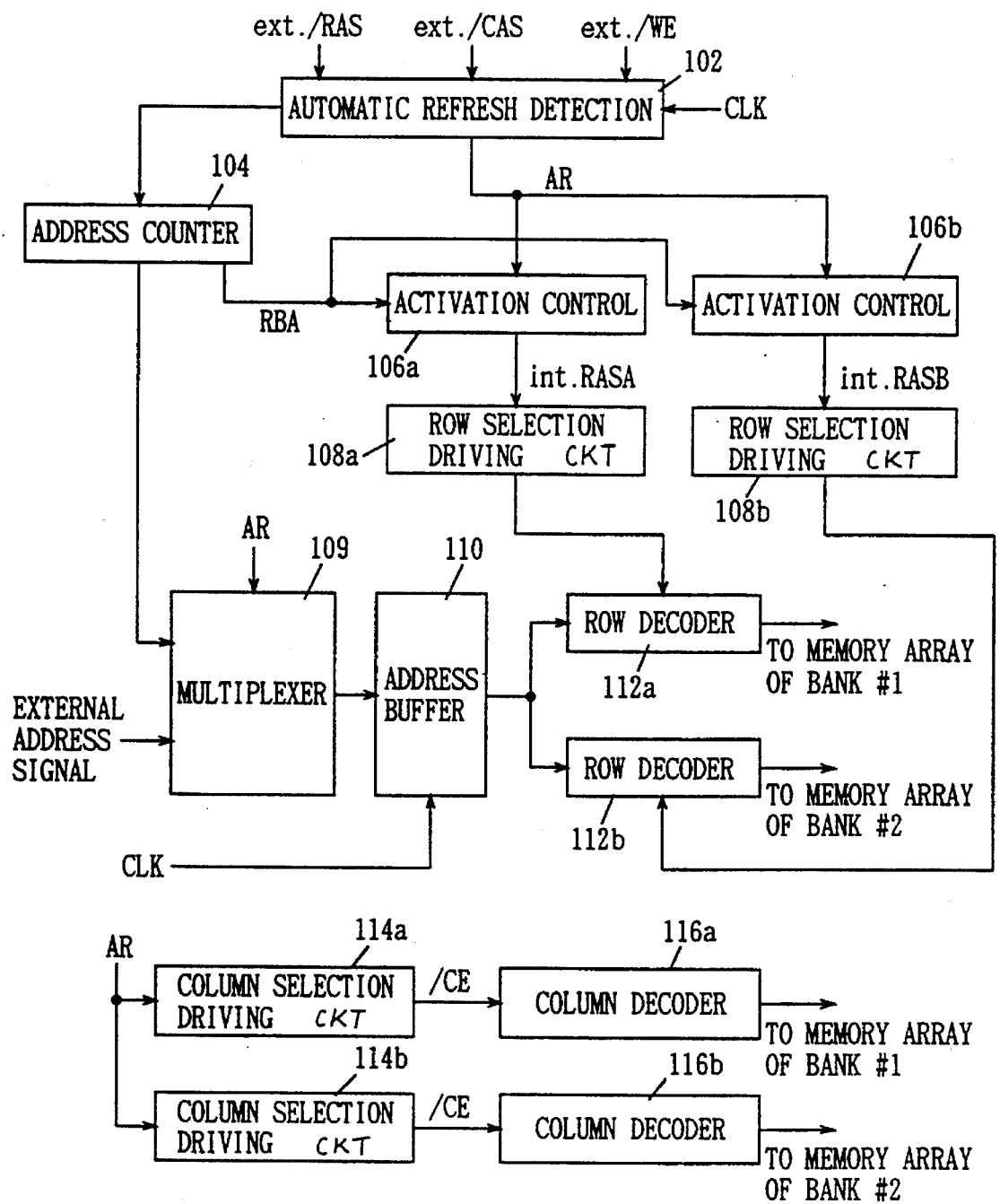
FIG. 9 functionally illustrates structures of portions of the SDRAM according to the present invention in relation to a refresh operation.

FIG. 9 illustrates structures of portions which are related to the refresh operation of the SDRAM. Referring to FIG. 9, the SDRAM includes an automatic refresh detection circuit 102 which determines states of the external control signals ext./RAS, ext./CAS and ext./WE on a leading edge of the clock signal CLK to detect whether or not an automatic refresh mode is specified, an address counter 104 which generates a refresh address, activation control circuits 106a and 106b which generate internal RAS signals int.RASA and int.RASB for the banks #1 and #2 specified in the automatic refresh modes in response to the bank address RBA generated from the address counter 104 and an automatic refresh detection signal AR generated from the automatic refresh detection circuit 102, and row selection driving circuits 108a and 108b which drive circuitry related to row selection of corresponding memory arrays in response to the internal RAS signals int.RASA and int.RASB from the activation control circuits 106a and 106b.

The automatic refresh detection circuit 102 is included in the first control signal generation circuit 20 while the activation control circuits 106a and 106b and the row selection driving circuits 108a and 108b are included in the second control signal generation circuit 22 in the structure shown in FIG. 1.

Control circuitry (not shown in FIG. 9) is separately provided for activating the memory arrays when input of an active command. The control circuits which operate in response to the active command also generate internal RAS signals. Therefore, outputs resulting from ORs of the internal RAS signal generated in response to the active command and the internal RAS signals int.RASA and int.RASA from the activation control circuits 106a and 106b are supplied to the row selection driving circuits 108a and 108b.

Referring to FIG. 9, the SDRAM further includes a multiplexer 109 which selectively passes either the refresh address signal (address indicating a row of the memory cells to be refreshed) from the address counter 104 or an external address signal in accordance with the automatic refresh detection signal AR, an address buffer 110 which takes in the address signal received from the multiplexer 109 in response to the clock signal CLK, and row decoders 112a and 112b which decode internal row address signals from the address buffer 110.

Operations of the row decoders 112a and 112b are controlled by control signals from the row selection driving circuits 108a and 108b respectively. The row decoder 112a selects a row of memory cells in the memory array 1a of the bank #1, while the row decoder 112b selects a row of the memory array 1b of the bank #2.

As shown in FIG. 2, a set of word lines WL, i.e., four word lines WL in total, is selected in two memory mats in practice. At this time, each word line WL to be refreshed may be activated at arbitrary timing relationship. The word lines WL may be selected (increased in potential) at different timings between the memory array blocks. In order to simplify the illustration, it is assumed here that a single row of memory cells are selected in each of the banks #1 and #2 in accordance with outputs of the row decoders 112a and 112b.

In the structure shown in FIG. 9, the row selection driving circuits 108a and 108b are adapted to drive the row decoders 112a and 112b respectively. These row selection driving circuits 108a and 108b also have functions of generating word line driving signals and transmitting the same onto the selected word lines WL through the row decoders 112a and 112b, while further generating sense amplifier activation signals for activating the sense amplifiers SA1 and SA2 in the memory arrays 1a and 1b.

In the structure shown in FIG. 9, further, the multiplexer 109 is provided in front of the address buffer 110. Alternatively, this multiplexer 109 may be provided on an output side of the address buffer 110.

The SDRAM further includes column selection driving circuits 114a and 114b for controlling column selecting operations in response to the automatic refresh detection signal AR, and column decoders 116a and 116b which are respectively activated in response to column selection enable signal /CE generated from the column selection driving circuits 114a and 114b for decoding column address signals supplied from paths which are not shown in FIG. 9 and generating column selection signals.

When the automatic refresh detection signal AR is in an active state to specify an automatic refresh operation, the column selection driving circuits 114a and 114b inhibit operations of the column decoders 116a and 116b, thereby reducing power consumed by the circuits which are related to column selecting operations in the automatic refresh mode. The column selection driving circuits 114a and 114b are included in the second control signal generation circuit 22 shown in FIG. 1. The operation is now briefly described.

When an automatic refresh command is supplied, the automatic refresh detection circuit 102 brings the automatic refresh mode detection signal AR into a high-level active state. The automatic refresh detection circuit 102 also increments the count value of the address counter 104 by 1. The activation control circuits 106a and 106b generate internal RAS signals int.RAS (genericly indicating the internal RAS signals int.RASA and int.RASB) in response to the bank address RBA from the address counter 104 and the automatic refresh mode detection signal AR.

When the bank address RBA received from the address counter 104 specifies the bank #1, the activation control circuit 106a generates the internal RAS signal int.RASA. When the bank address RBA received from the address counter 104 indicates the bank #2, on the other hand, the activation control circuit 106b is activated to generate the internal RAS signal int.RASB in response to the automatic refresh detection signal AR.

In response to the internal RAS signal int.RAS generated from the activation control signal 106a or 106b, the corresponding row selection driving circuit 108a or 108b is activated to execute a row selecting operation (word line selection and sense amplifier driving) with respect to the selected bank #1 or #2.

On the other hand, the multiplexer 109 selects the refresh address which is supplied from the address counter 104 in response to the automatic refresh detection signal AR, to supply the same to the address buffer 110. The address buffer 110 generates an internal address in accordance with the refresh address from the address counter 104, to supply the same to the row decoders 112a and 112b. One of the row decoders 112a and 112b is activated by an output of the row selection driving circuit 108a or 108b, so that a corresponding row is selected in the specified bank #1 or #2 and the memory cells connected to the selected row are refreshed.

At this time, the column selection driving circuits 114a and 114b set the column selection enable signals /CE in high-level inactive states in response to the automatic refresh mode detection signal AR. Thus, the column decoders 116a and 116b are inhibited from decoding operations, to carry out no column selecting operations.

After a lapse of a prescribed time from supply of the automatic refresh command, the automatic refresh detection signal AR as well as the internal RAS signal int.RAS enter inactive states, whereby the row selecting operation in the specified bank #1 or #2 is brought into an inactive state so that the selected word line WL enter a non-selected state and the sense amplifier SA1 or SA2 enters a non-operating state.

When another automatic refresh command is supplied, an operation similar to the above is executed. At this time, the count value of the address counter 104 is incremented by 1. The bank address RBA is expressed in the least significant bit of the address counter 104. Therefore, the banks #1 and #2 are switched alternately so that a refresh operation is executed for the bank which is different from the previously refreshed one. Thus, the automatic refresh operation shown in FIG. 8 is implemented.

When the automatic refresh command is supplied, the refresh operation is automatically executed and completed internally to return to a precharged state. In order to check the function of the address counter 104, it is necessary to drive the same to write and read test data in and from the memory cells. Data reading may be carried out in a normal mode. When an array activating period is internally set at a prescribed time period in the automatic refresh operation, there is a possibility that no test data can be reliably written in selected memory cells from the exterior (data writing is carried out through the write register 16a or 16b). When the column selecting operations are inhibited for reducing power consumption in the automatic refresh operation, the test data cannot be written and read. A structure for reliably testing the address counter 104 is now described.

First, a counter check mode for testing whether or not the refresh address counter 104 normally operates is described. In this counter check mode, the following operations are executed:

(a) An automatic refresh command is supplied so that a corresponding row is selected by a refresh address from the refresh address counter 104.

(b) A write command is supplied to select a column, thereby writing test data in the selected memory cells.

(c) The above operations are repeated until all count values of the refresh address counter 104 are generated. When the refresh address counter 104 is a 10-bit counter, for example, the aforementioned operations are repeated $2^{10}=$ 1024 times. In general, the same column address is supplied to select the same column.

(d) A read command is repeatedly supplied in a normal mode, to select a row and a column and successively read the test data having been written in the memory cells. At this time, the same column address as that supplied in writing of the test data is employed.

(e) Match/mismatch of the read test data and the written data is determined. If all read data match with the written test data, the refresh address counter 104 is determined to be normal.

In the step (d), an automatic refresh command may be supplied in place of the normal mode, so that row selection is performed by a refresh address which is generated from the refresh address counter 104 and then column selection is performed by a read command to read the data.

As clearly understood from the aforementioned operation steps (a) to (e), it is necessary to execute a column selecting operation in the counter check mode. In the SDRAM which inhibits column selecting operations in an automatic refresh mode for reducing power consumption, it is necessary to bring a column selecting circuit into an operable state in the counter check mode.

In the SDRAM, further, the test data are transmitted to the selected memory cells after the same are stored in the write registers 16a and 16b. In the automatic refresh operation, an array activating period is automatically decided in the interior. In the counter check mode, therefore, it is necessary to provide sufficiently large operation margins for the test data writing, thereby reliably writing the test data in the memory cells.

In the automatic refresh mode, further, the refresh address counter 104 generates refresh addresses alternately selecting the banks #1 and #2. Namely, the refresh addresses include refresh row addresses for specifying rows of the memory cells in the banks #1 and #2 and refresh bank addresses RBA for specifying the refreshing banks #1 and #2. When a write command is supplied in the counter check mode, it is necessary to also supply the bank address. In the counter check mode, therefore, it is necessary to recognize the refresh bank address RBA which is generated by the refresh address counter 104 in the exterior.

Description is now made in order on a structure for attaining the aforementioned objects that (1) the refresh operation is not automatically completed after a lapse of a prescribed period in the interior, i.e., the memory array 1a or 1b will not return to a precharged state if an automatic refresh command is supplied in a counter check mode, (2) a column selection related circuit is brought into an operable state if an automatic refresh command is supplied in the counter check mode, and (3) it is possible to recognize the currently refreshed bank in the exterior when an automatic refresh command is supplied in the counter check mode.

A: Inhibition of Automatic Precharge

Figure 10:
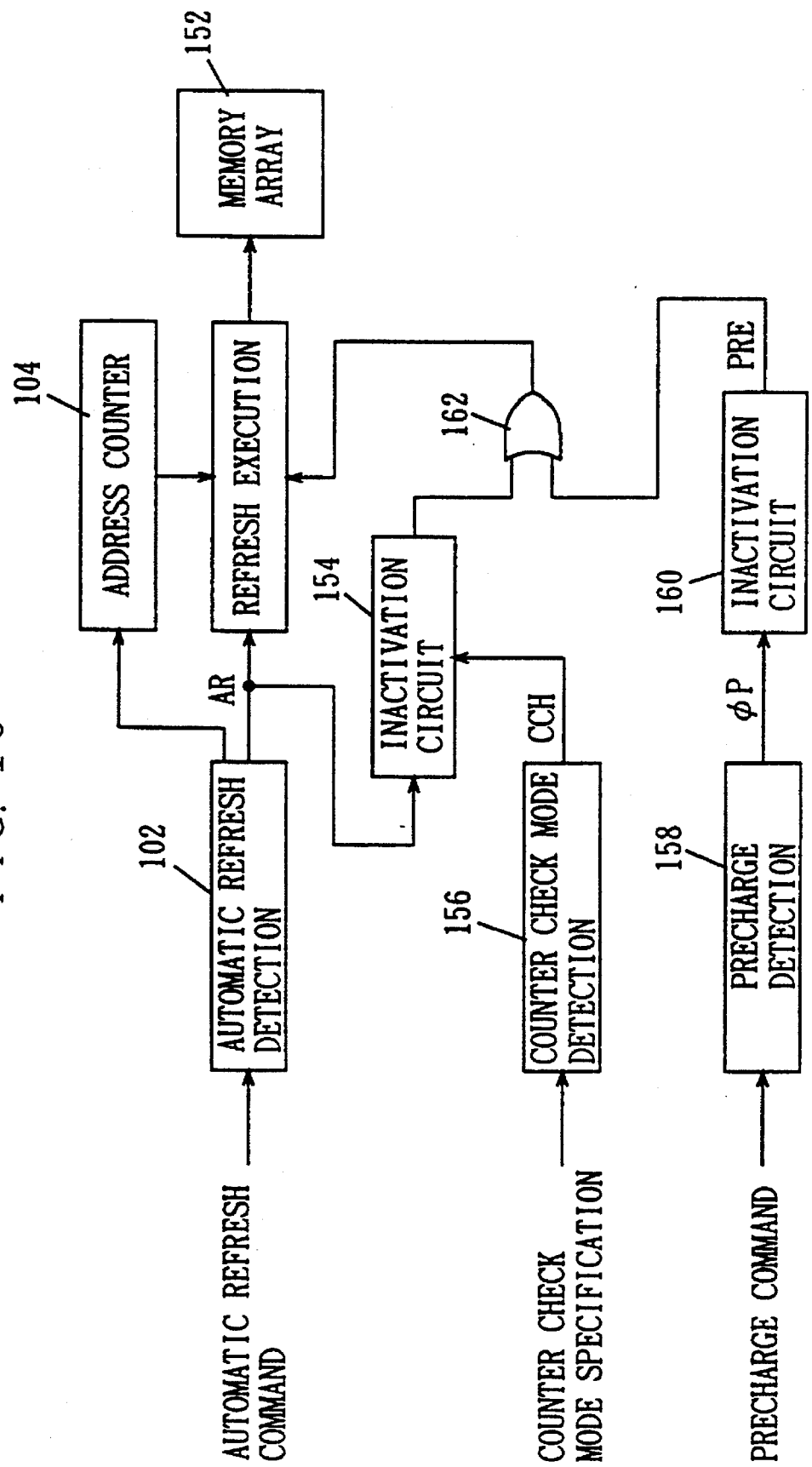
FIG. 10 functionally illustrates a structures of a refresh operation control part according to the present invention.

FIG. 10 illustrates a conceptional structure for inhibiting automatic precharging in the interior upon supply of an automatic refresh command in a counter check mode. Referring to FIG. 10, a refresh execution unit 150 refreshes memory cells of a memory array 152 in accordance with the automatic refresh detection signal AR received from the automatic refresh detection circuit 102 and the refresh address from the address counter 104. This refresh execution unit 150 includes the activation control circuits 106a and 106b, the row selection driving circuits 108a and 108b, the row decoders 112a and 112b, the multiplexer 109, and the address buffer 110 shown in FIG. 9. Therefore, the memory array 152 includes both memory arrays 1a and 1b of the banks #1 and #2.

An inactivation circuit 154 inactivates the refresh execution unit 150 through an OR gate 162 after a lapse of a prescribed time in response to the automatic refresh detection signal AR received from the automatic refresh detection circuit 102. Thus, the memory array 152 returns to a precharged state, and the refresh operation is completed.

A counter check mode detection circuit 156 generates a counter check mode detection signal CCH in response to an externally supplied counter check mode command, and supplies the same to the inactivation circuit 154. The inactivation circuit 154 is brought into an inoperable state upon supply of the counter check mode detection signal CCH. In other words, the refresh execution unit 150 is inhibited from automatically entering an inactive state when the counter check mode detection signal CCH is in an active state.

A precharge detection circuit 158 generates a precharge detection signal φP when a precharge command is received. An inactivation circuit 160 generates a precharge command signal PRE which enters an active state for a prescribed period in response to the precharge detection signal φP. This precharge command signal PRE is supplied to the refresh execution unit 150 through an OR gate 162, to bring the refresh execution unit 150 into an inactive state. When a counter check mode command is supplied, a refresh operation executed by the refresh execution unit 150 in accordance with an automatic refresh command is terminated along the precharge command signal PRE received from the inactivation circuit 160. The precharge command is supplied from the exterior and hence completion of the automatic refresh operation can be specified in the exterior, so that the test data can be written in the selected memory cells with sufficient operation margins in writing of the test data in the automatic refresh mode.

The counter check mode detection circuit 156, the precharge detection circuit 158, the inactivation circuits 154 and 160 and the OR gate 162 shown in FIG. 10 are included in the first control signal generation circuit 20 shown in FIG. 1. Specified structures of the respective units are now described.

Figure 11:
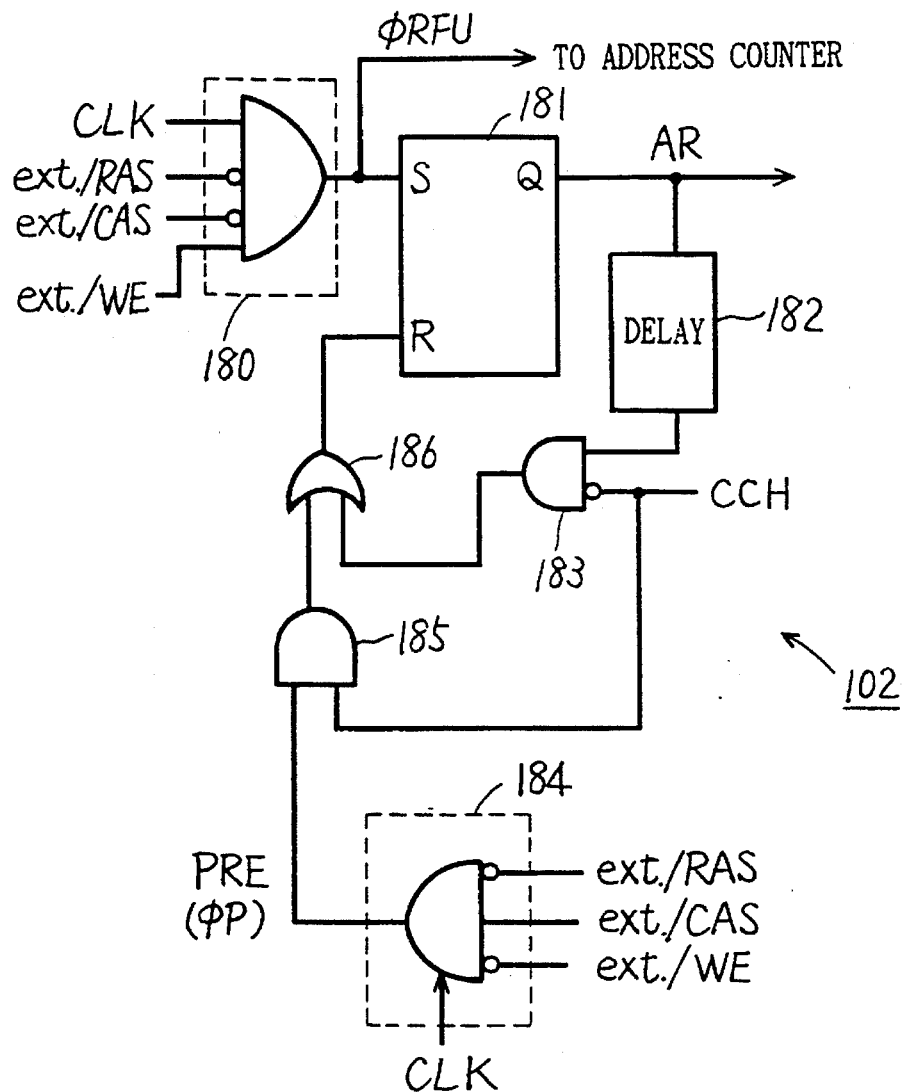
FIG. 11 shows an exemplary structure of an automatic refresh detection circuit shown in FIGS. 9 and 10.

FIG. 11 illustrates a specific structure of the automatic refresh detection circuit 102 shown in FIG. 10. Referring to FIG. 11, the automatic refresh detection circuit 102 includes a state decoder 180 which receives the external control signals ext./RAS, ext./CAS and ext./WE and the external clock signal CLK for detecting supply of an automatic refresh command, a set/reset flip-flop 181 which is set in response to an automatic refresh command detection signal φRFU received from the state decoder 180 for generating an automatic refresh detection signal AR, a delay circuit 182 for delaying the automatic refresh detection signal AR for a prescribed period, and a gate circuit 183 which receives an output of the delay circuit 182 and the counter check mode detection signal CCH. The output φRFU from the state decoder 180 is employed as a count-up instructing signal for a refresh address.

The gate circuit 183 fixes its output at a low level when the counter check mode detection signal CCH enters a high-level active state, to inhibit transmission of the output from the delay circuit 182. When the counter check mode detection signal CCH enters a low-level inactive state, on the other hand, the gate circuit 183 serves as a buffer to transmit the output of the delay circuit 182.

The automatic refresh detection circuit 102 further includes a gate circuit 185 which receives the counter check mode detection signal CCH and the precharge command (or detection) signal PRE (or φP) from the state decoder 184, and a gate circuit 186 which receives outputs from the gate circuits 185 and 183. An output of the gate circuit 186 is supplied to a reset input R of the set/reset flip-flop 181.

The state decoder 184 is activated in response to the clock signal CLK, to generate a signal which is responsive to combination of current states of the external control signals ext./RAS, ext./CAS and ext./WE. When the combination of the states of the external control signals indicates a precharge command, the state decoder 184 generates the precharge command signal PRE (or the precharge detection signal φP). In the structure shown in FIG. 11, the state decoders 180 and 184 are shown as logic gates which directly receive the external signals respectively.

Alternatively, RAS, CAS and WE buffers may incorporate corresponding ones of the external control signals in response to the external clock signal CLK to determine the operation mode in accordance with the states of the incorporated internal signals so that a signal showing the result of the determination is latched in accordance with a leading edge of the clock signal CLK. The structures of the state decoders 180 and 184 appearing in FIG. 11 are merely intended to illustrate functional operations thereof. These state decoders 180 and 184 are activated when a signal/CS is at a low level. The operation is now described.

(a) Normal Mode

In a normal mode for carrying out ordinary data read and write operations, the output of the state decoder 180 is at a low level, while the counter check mode detection signal CCH is also at a low level. The output AR of the set/reset flip-flop 181 is not changed and maintains a low-level reset state.

Even if the state decoder 184 generates the precharge command (or detection) signal PRE (or φP) in response to a precharge command, the output of the gate circuit 185 is at a low level (the signal CCH is at a low level, and the gate circuit 185 outputs a high-level signal only when both inputs are at high levels). Therefore, the output AR of the set/reset flip-flop 181 is never changed but maintains a low level in the normal mode.

(b) Automatic Refresh Mode (with no Counter Check)

When no counter check operation is carried out, the counter check mode detection signal CCH is in a low-level inactive state. Thus, the gate circuit 183 functions as a buffer, while the output of the gate circuit 185 is fixed at a low level. When an automatic refresh command is supplied, the output of the state decoder 180 rises to a high level and the output AR of the set/reset flip-flop 181 also rises to a high-level in a set state. In response to this signal AR, a refresh operation is carried out in the interior. After a lapse of a prescribed time, the output of the delay circuit 182 rises to a high level, and the output of the gate circuit 183 also rises to a high level in responsively. Thus, the set/reset flip-flop 181 is reset through the gate circuit 186, so that the signal AR falls to a low level in a reset state.

The precharge command signal PRE outputted from the state decoder 184 is entirely ignored by the gate circuit 185, whereby the refresh operation is automatically completed in the interior so that the memory array 152 returns to a precharged state. The automatic refresh command detection signal φRFU outputted from the state decoder 180 is supplied to the address counter 104, which in turn increments its count value by 1 in accordance with this signal φRFU.

(c) Automatic Refresh in Counter Check Mode

In this state, the counter check mode detection signal CCH is set at a high level. The output of the gate circuit 183 is fixed at a low level, and the output of the delay circuit 182 is ignored. When an automatic refresh command is supplied in this state, the output AR of the set/reset flip-flop 181 is brought into a set state by the state decoder 180, so that the signal AR rises to a high level. Even if the output of the delay circuit 182 rises to a high level after a lapse of a prescribed time, this output is ignored by the gate circuit 183.

The state decoder 184 raises up the precharge command (or detection) signal PRE (or φP) to a high level in response to a precharge command. In response to this, the output of the gate circuit 185 rises to a high level, and the set/reset flip-flop 181 is reset through the gate circuit 186, so that its output AR falls to a low level. Thus, the refresh operation is completed and the array 152 returns to a precharged state.

Figure 12A:
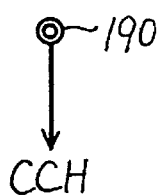
FIGS. 12A and 12B illustrate structures for generating a counter check mode detection signal shown in FIG. 11.
Figure 12B:
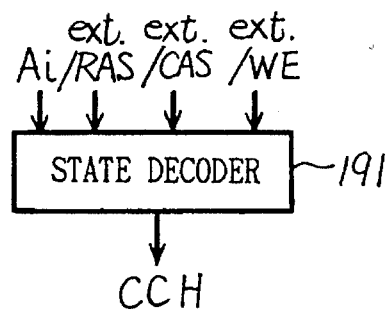

FIGS. 12A and 12B illustrates structures for generating the counter check mode detection signal CCH. As shown in FIG. 12A, the counter check mode detection signal CCH may be directly supplied from the exterior through an external pin terminal 190. This pin terminal 190 may be dedicatedly prepared, or may be prepared utilizing an unused pin terminal, or a specific terminal receiving voltage set at a high or level than an ordinarily employed voltage level for generating the counter check mode detection signal CCH.

Alternatively, the counter check mode detection signal CCH may be generated from a state decoder 191 by combination of the external control signals ext./RAS, ext./CAS and ext./WE and a prescribed address bit Ai, as shown in FIG. 12B. The state decoder 191 may be similar in structure to the state decoders 180 and 184 shown in FIG. 11.

Figure 13:
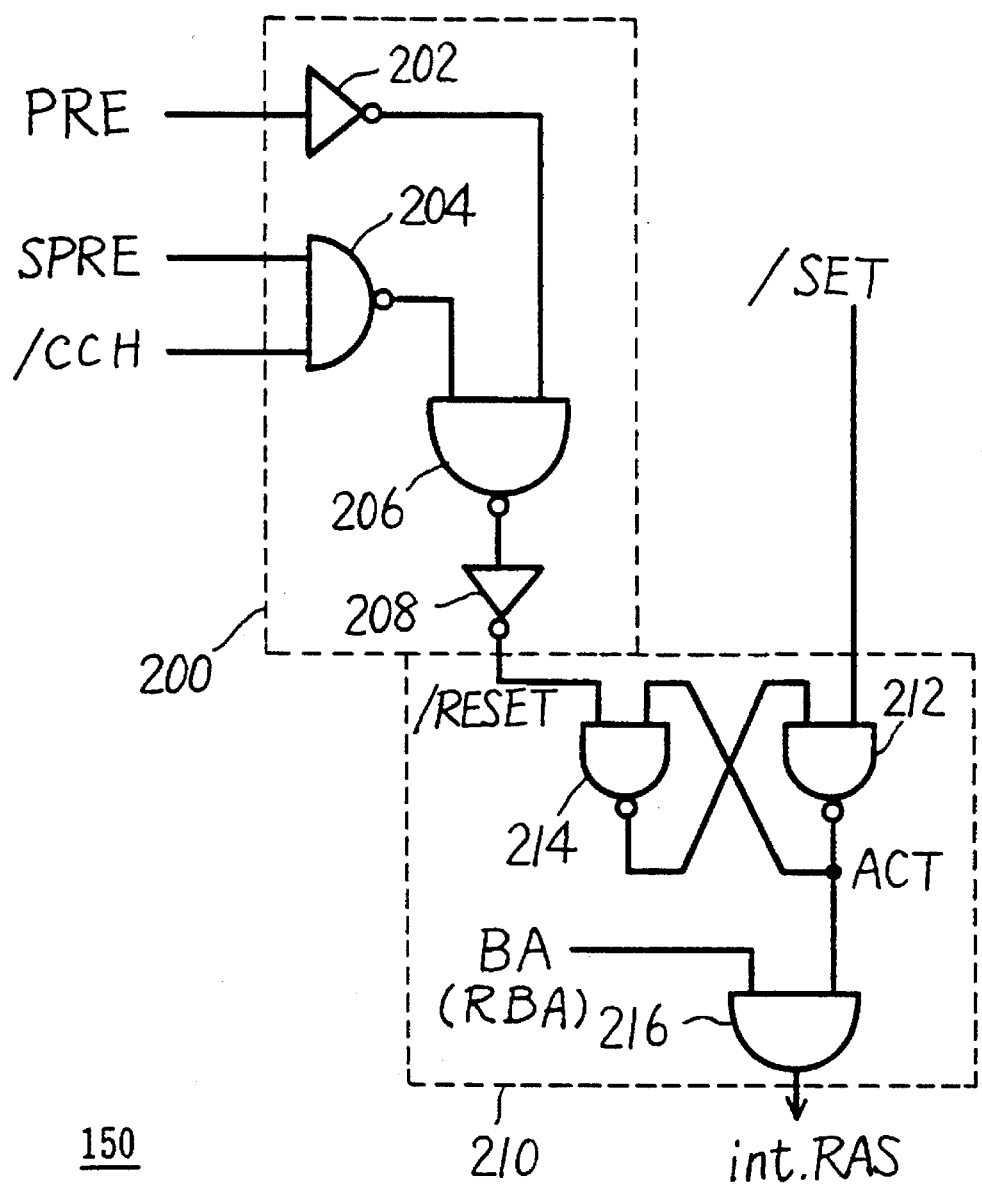
FIG. 13 illustrates a structure for selectively controlling a refresh period according to the present invention.

FIG. 13 illustrates structures of principal parts of the refresh execution unit 150 and the gate circuit 162 shown in FIG. 10. Referring to FIG. 13, array activation/inactivation control circuitry includes an array inactivation control block 200 which generates a reset signal /RESET in response to the precharge command signal PRE, a self-precharge command signal SPRE and a counter check mode detection signal /CCH, and an array activation control block 210 which generates an internal RAS signal int.RAS for bringing a selected bank into an inactive and an active state in response to the reset signal /RESET received from the array inactivation control block 200 and a set signal /SET generated in array activation.

The self-precharge command signal SPRE is generated (activated) after a lapse of a predetermined time when an automatic refresh command is supplied. This may be outputted from the delay circuit 182 shown in FIG. 11. The set signal /SET is generated in response to an automatic refresh command or an active command. Active states of the signals /SET and /RESET are low levels. Further, an active state of the counter check mode detection signal /CCH which is supplied to the array inactivation control block 200 is also at a low level.

The array inactivation control block 200 includes an invertor circuit 202 which receives the precharge command signal PRE, a two-input NAND circuit 204 which receives the self-precharge command signal SPRE and the counter check mode detection signal /CCH, another two-input NAND circuit 206 which receives outputs of the NAND circuit 204 and the invertor circuit 202, and another invertor circuit 208 which receives an output of the NAND circuit 206. The invertor circuit 208 generates the reset signal /RESET.

The array activation control block 210 includes a NAND flip-flop which is formed by NAND circuits 212 and 214, and a gate circuit 216 which receives an internal activation signal ACT outputted from the NAND circuit 212 and a bank address BA. The NAND circuit 212 receives the set signal /SET at its one input, while receiving an output of the NAND circuit 214 at its other input. The NAND circuit 214 receives the reset signal /RESET at its one input, while receiving an output of the NAND circuit 212 in its other input.

The gate circuit 216 is activated in accordance with the bank address signal BA, to generate the internal RAS signal int.RAS in response to the output of the NAND circuit 212. Therefore, the structure of the gate circuit 216 is varied with the value of a bank address BA which is assigned to the corresponding bank #1 or #2. With respect to the bank #1, the gate circuit 216 is activated when the bank address BA is "0", i.e., at a low level. With respect to the bank #2, on the other hand, the gate circuit 216 is activated when the bank address BA is "1", i.e., at a high level.

The structure shown in FIG. 13 corresponds to the activation control circuits 106a and 106b shown in FIG. 9. In correspondence to the structure shown in FIG. 10, the array activation control block 210 is included in the refresh execution unit 150 and the gate circuit 204 is included in the inactivation circuit 154, while the invertor circuit 202, the gate circuit 206 and the invertor circuit 208 correspond to the gate circuit 162. Generation circuits for the respective signals are now described.

Figure 14:
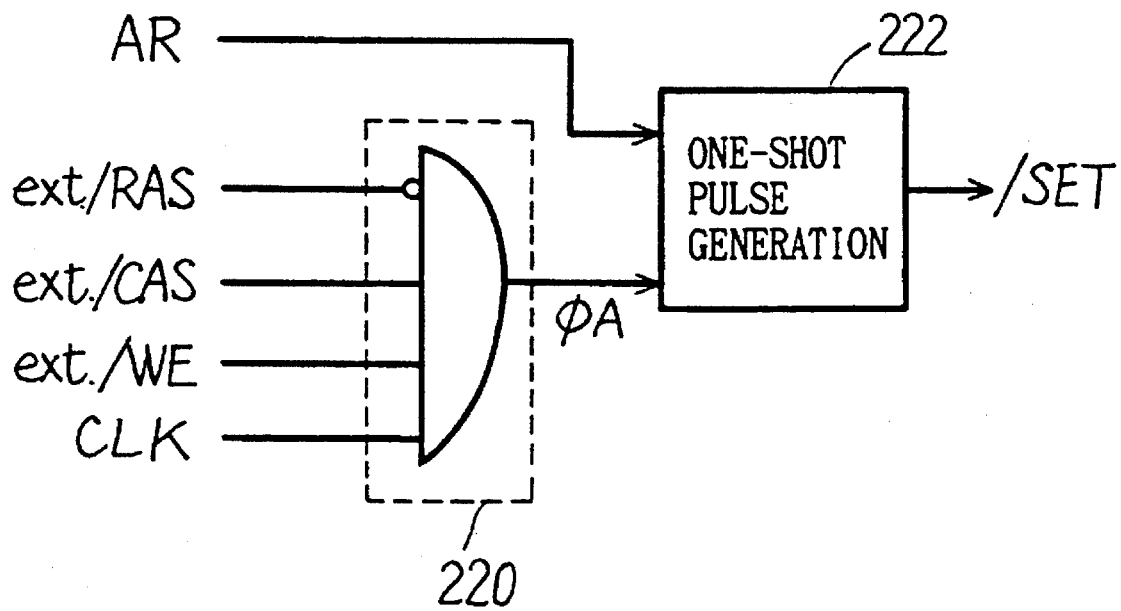
FIG. 14 illustrates an exemplary structure for generating a set signal shown in FIG. 13.

FIG. 14 illustrates a circuit structure for generating the set signal /SET. Referring to FIG. 14, a state decoder 220 detects whether or not an active command is supplied in accordance with the external control signals ext./RAS, ext./CAS and ext./WE and the external clock signal CLK. When the signal/CS (not shown) is at a low level and the combination of the states of the external control signals on a leading edge of the clock signal CLK indicates an active command, the state decoder 220 generates an active command detection signal φA.

A one-shot pulse generation circuit 222 generates one-shot pulses when either the active command detection signal φA or the automatic refresh mode detection signal AR is generated.

Figure 15:
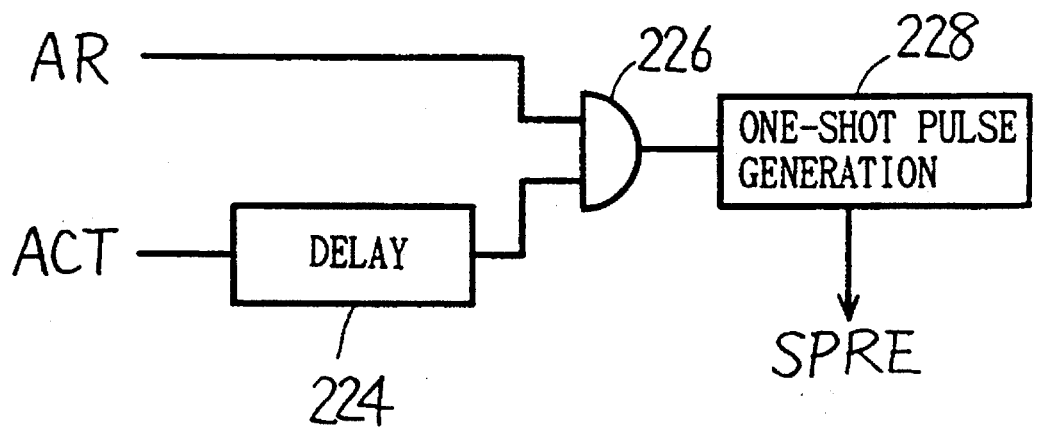
FIG. 15 illustrates an exemplary structure for generating a self-precharge command signal shown in FIG. 13.

FIG. 15 illustrates a circuit structure for generating the self-precharge command signal SPRE. Referring to FIG. 15, a self-precharge command signal generation circuit includes a delay circuit 224 which delays the internal activation signal ACT for a prescribed time, a gate circuit 226 which passes an output of the delay circuit 224 when the automatic refresh mode detection signal AR is in an active state, and a one-shot pulse generation circuit 228 which generates one-shot pulses in response to an output of the gate circuit 226.

Figure 17:
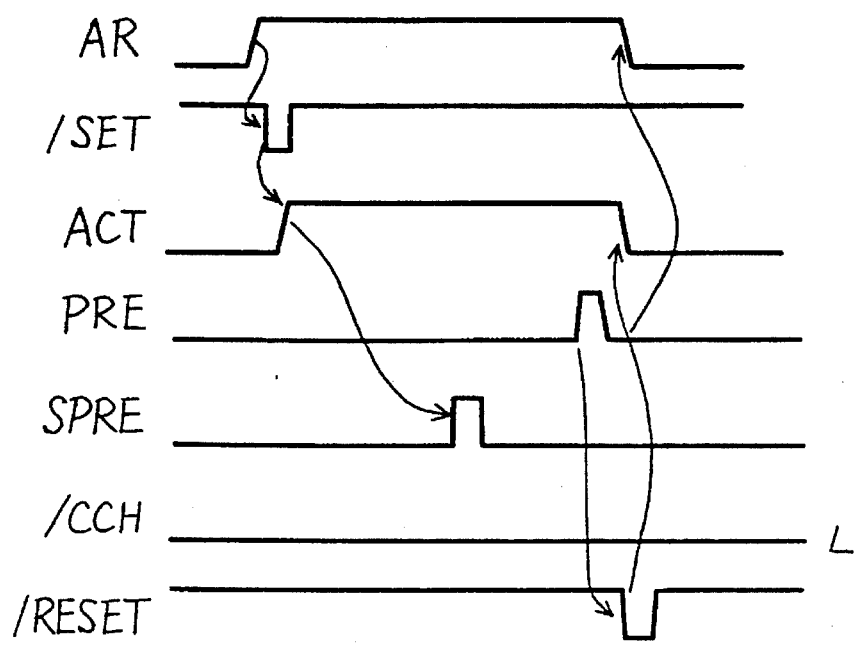
FIG. 17 is a signal waveform diagram showing an automatic refresh operation of the circuit appearing in FIG. 13 in a counter check mode.
Figure 18:
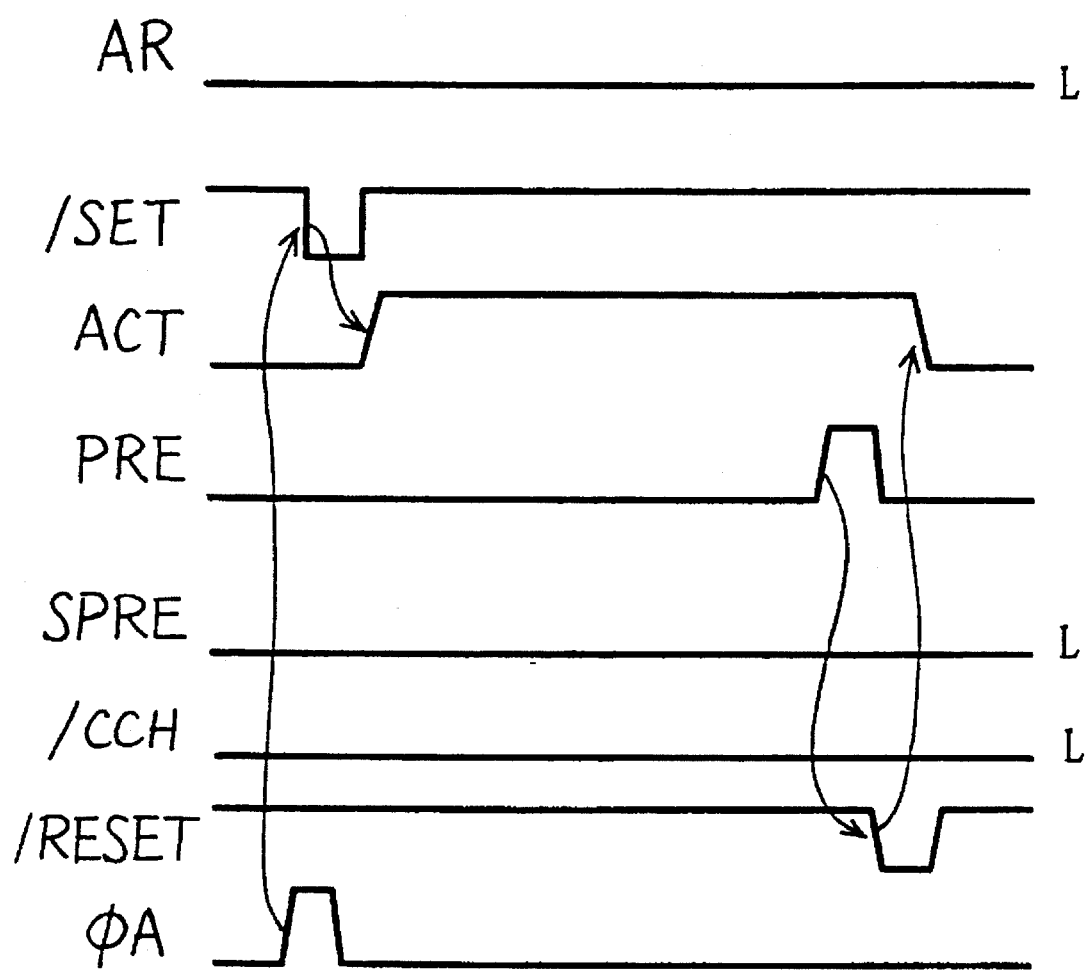
FIG. 18 is a signal waveform diagram showing an operation of the circuit appearing in FIG. 13 in a normal mode.

The one-shot pulse generation circuit 228 generates the self-precharge command signal SPRE. A delay time which is determined by the delay circuit 224 defines an activation duration of an array in an automatic refresh operation. The operation of the circuit shown in FIG. 13 is now described with reference to FIGS. 16 to 18 showing operation waveform diagrams.

(a) Automatic Refresh Operation

Figure 16:
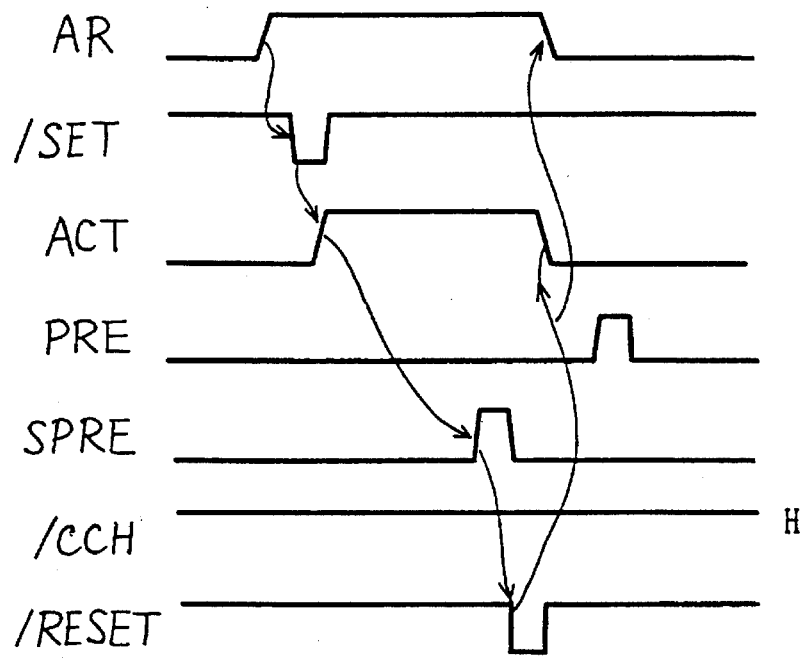
FIG. 16 is a signal waveform showing operations of the circuits appearing in FIG. 13 in an automatic refresh mode.

FIG. 16 is a signal waveform diagram showing operations of the circuits shown in FIG. 13 in an automatic refresh operation accompanied with no counter check mode. When an automatic refresh command is supplied, the automatic refresh mode detection signal AR rises to a high level. The counter check mode detection signal /CCH is in a high-level inactive state. In response to the rise of the automatic refresh mode detection signal AR, the set signal /SET falls to a low level for a prescribed period in the form of a one-shot pulse. Thus, the internal activation signal ACT which is outputted from the NAND circuit 212 goes high. In accordance with this internal activation signal ACT, the internal RAS signal int.RAS is generated so that a refresh operation is executed in the selected bank #1 or #2.

After a lapse of a certain time, the output of the delay circuit 224 shown in FIG. 15 so rises that the one-shot pulse generation circuit 228 (see FIG. 15) generates the self-precharge command signal SPRE. In response to this self-precharge command signal SPRE, the output of the NAND circuit 204 (FIG. 13) falls to a low level and the output of the NAND circuit 206 rises to a high level, so that the reset signal /RESET falls to a low level through the invertor circuit 208.

In response to this fall of the reset signal /RESET, the output of the NAND circuit 214 goes high and the internal activation signal ACT from the NAND circuit 212 goes low in response (the set signal /SET is at a high level). Thus, the internal RAS signal int.RAS goes low, to complete the refresh operation.

(b) Automatic Refresh Operation in Counter Check Mode

With reference to FIG. 17, an automatic refresh operation in a counter check mode is now described. In this operation mode, the counter check mode detection signal /CCH is set in a low-level active state. Thus, the output of the NAND circuit 204 shown in FIG. 13 is fixed to a high level, and the self-precharge command signal SPRE is ignored.

When an automatic refresh command is supplied, the automatic refresh mode detection signal AR rises and the set signal /SET is generated in response in the form of one-shot pulses. In response to this set signal /SET, the internal activation signal ACT enters a high-level active state. Even if the self-precharge signal SPRE is generated after a lapse of a prescribed time, the output of the NAND circuit 204 is fixed at a high level and the reset signal /RESET maintains the high-level state.

When a precharge command is supplied, the precharge command signal PRE is generated in the form of one-shot pulse. Thus, the output of the invertor circuit 204 falls to a low level and the output of the NAND circuit 206 goes high so that the reset signal /RESET falls to a low level through the invertor circuit 208. Then, the internal activation signal ACT is reset to a low level, so that the array returns to a precharged state.

(c) Normal Mode

An operation in a normal mode for writing and reading data is now described with reference to FIG. 18 showing an operation waveform diagram. In the normal mode, the automatic refresh mode detection signal AR is set at a low level. In this state, no self-precharge command signal SPRE is generated, as clearly understood from the structure shown in FIG. 15.

In response to an active command, the active command detection signal φA rises to a high level in the form of one-shot pulse. In response to this active command detection signal φA, the set signal /SET enters a low-level active state in the form of one-shot pulse, so that the internal activation signal ACT is generated. When a precharge command is supplied, the precharge command signal PRE rises to a high level, so that the reset signal /RESET falls to a low level through the invertor circuit 202, the NAND circuit 206 and the invertor circuit 208.

The output of the NAND circuit 204 is at a high level since the self-precharge command signal SPRE is at a low level. In response to this reset signal /RESET, the internal activation signal ACT enters a low-level inactive state, to attain an array precharged state.

As hereinabove described, it is possible to specify completion of the refresh operation, i.e., return of the array to a precharged state from the exterior in the counter check mode operation by selectively ignoring the self-precharge command signal SPRE by the counter check mode detection signal CCH or /CCH, thereby reliably ensuring a time for writing the test data in the selected memory cells.

B: Selective Allowance for Column Selecting Operation

Figure 19:
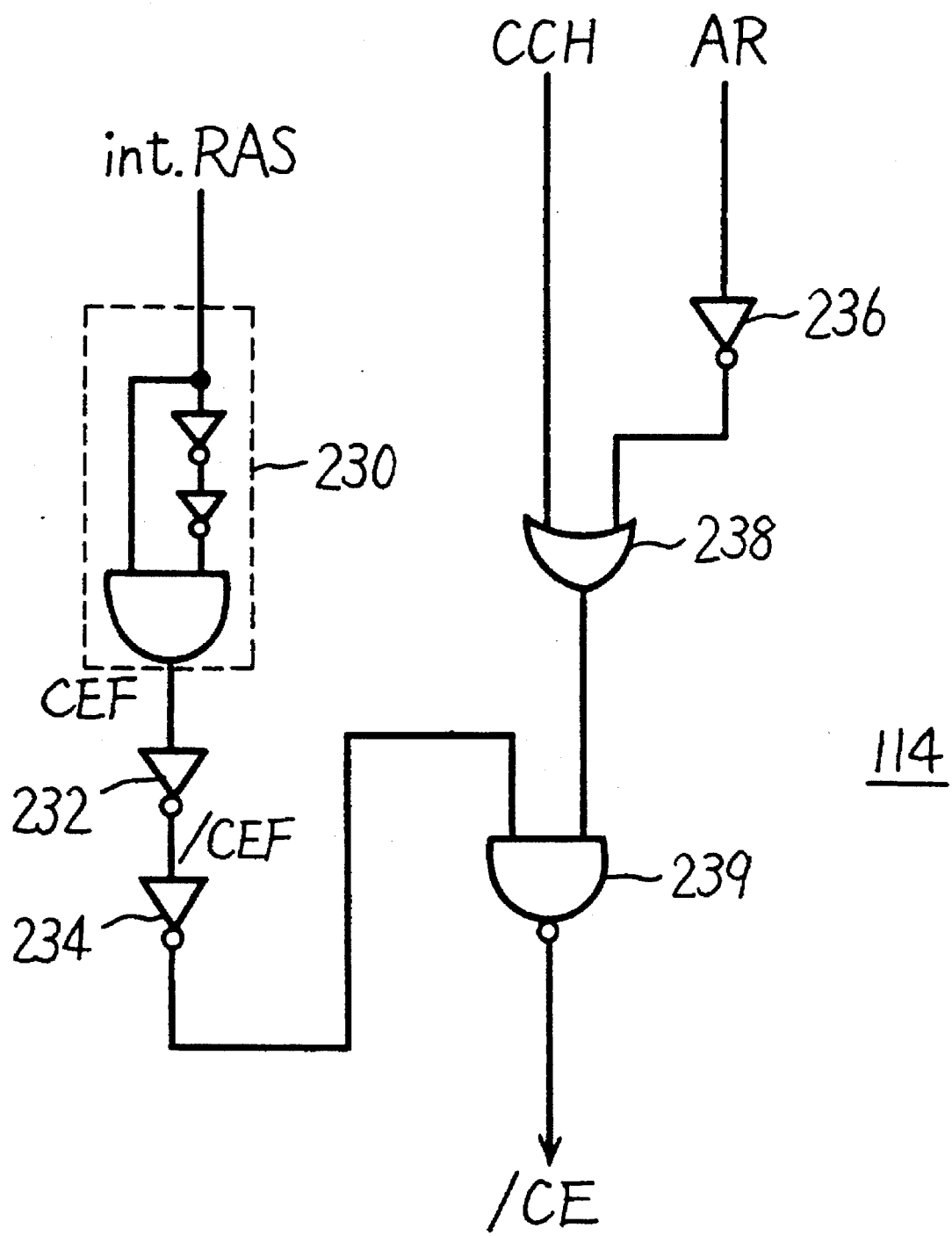
FIG. 19 illustrates a circuit structure for controlling a column selecting operation in a refresh operation according to the present invention.

FIG. 19 illustrates an exemplary structure of the column selection driving circuit 114a or 114b shown in FIG. 9. Referring to FIG. 19, the column selection control circuit 114 includes a rise delay circuit 230 which delays rise of the internal RAS signal int.RAS for a prescribed time, two-stage invertor circuits 232 and 234 which receive a trigger signal CEF outputted from the rise delay circuit 230, an invertor circuit 236 which receives the automatic refresh mode detection signal AR, a gate circuit 238 which receives an output of the invertor circuit 236 and the counter check mode detection signal CCH, and a gate circuit 239 which receives outputs of the invertor circuit 234 and the gate circuit 238.

The gate circuit 238 outputs a high-level signal when one of signals received at its inputs goes high. On the other hand, the gate circuit 239 outputs a low-level signal when both inputs go high. This gate circuit 239 generates the column enable signal /CE which enables a column selecting operation. This column enable signal /CE is shown being supplied only to the column decoder 116a or 116b in FIG. 9.

Figure 21:
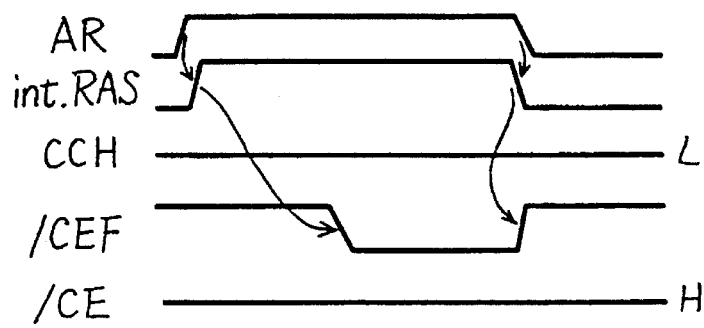
FIG. 21 is a signal waveform diagram showing an operation of the circuit shown in FIG. 19 in an automatic refresh mode.
Figure 22:
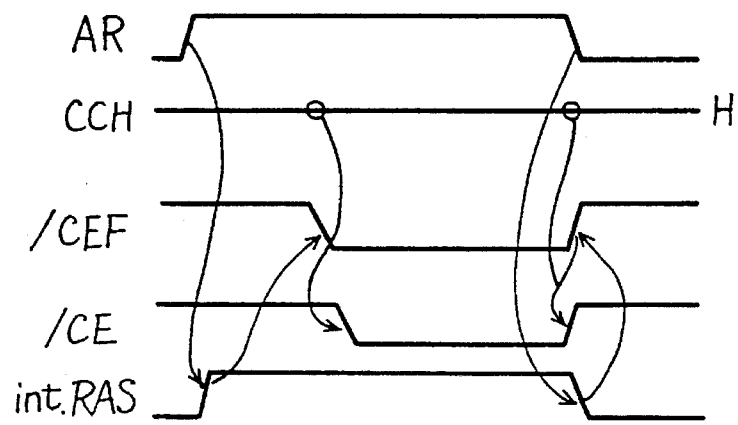
FIG. 22 is a signal waveform diagram showing an automatic refresh mode operation of the circuit of FIG. 19 in a counter check mode.

This column enable signal /CE may be supplied to the register control circuit 28 in the structure shown in FIG. 1, to selectively inhibit the operation of the register control circuit 28. When the register control circuit 28 is brought into an inoperable state, selection of a register for data input/output is inhibited so that writing and reading of data in and from the register can be inhibited. In this case, input/output buffers may also be brought into inoperable states. The operation is now described with reference to FIGS. 20 to 22 showing operation waveform diagrams.

(a) Normal Mode

Figure 20:
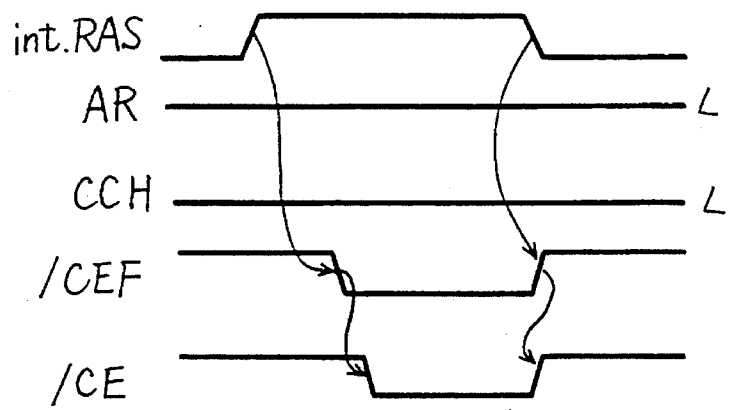
FIG. 20 is a signal waveform diagram showing an operation of the circuit shown in FIG. 19 in a normal mode.

FIG. 20 is an operation waveform diagram of the circuit shown in FIG. 19 in a normal mode. In the normal mode, both of the automatic refresh mode detection signal AR and the counter check mode detection signal CCH are at low levels. The internal RAS signal int.RAS rises in response to an active command. In response to this rise of the internal RAS signal int.RAS, the signal CEF which is outputted from the rise delay circuit 230 rises to a high level after a lapse of a prescribed time. Thus, a trigger signal /CEF which is outputted from the invertor circuit 232 falls to a low level from a high level.

Both of the signals AR and CCH are at low levels, and the gate circuit 238 outputs a high-level signal by the output of the invertor circuit 236. The gate circuit 239 brings the column enable signal /CE into a low level in response to the fall of the signal /CEF. Thus, a column selecting operation is enabled. When a write command or a read command is supplied from the exterior in this case, therefore, a column selecting operation is executed in accordance with a currently supplied column address signal, so that data can be written in or read from memory cells which are on the selected row and column.

A delay time required for bringing the column enable signal /CE into a low-level active state after rise of the internal RAS signal int.RAS may be that required for starting of column selection after row selection, and generally corresponds to a time called "RAS interlocking time".

(b) Automatic Refresh Mode (with no Counter Check)

In this operation mode, the counter check mode detection signal CCH is in a low-level inactive state. When an automatic refresh command is supplied, the automatic refresh mode detection signal AR rises to a high level and the output of the invertor circuit 236 falls to a low level. The output of the gate circuit 238 goes low, and the column enable signal /CE is fixed to a high level regardless of the state of the internal RAS signal int.RAS.

Therefore, a column selecting operation is inhibited during the internal RAS signal int.RAS is generated and a refresh operation is executed (operations of the column decoders 116a and 116b are inhibited in the structure shown in FIG. 9). After a lapse of a prescribed time, the automatic refresh mode detection signal AR falls to a low level (by the self-precharge command signal SPRE: see FIG. 13).

(c) Automatic Refresh Operation in Counter Check Mode

In the counter check mode, the counter check mode detection signal CCH is set in a high-level active state, and the output of the gate circuit 238 is set at a high level. When the automatic refresh mode detection signal AR is supplied, the internal RAS signal int.RAS rises to a high level. After a lapse of a prescribed time, the trigger signal /CEF falls to a low level, and the column enable signal /CE also falls to a low level. During this period, therefore, a column selecting operation can be carried out to access the memory cells which are selected in accordance with the column address from the exterior.

When a precharge command is supplied from the exterior in the counter check mode and the return to an array precharged state is specified, both of the automatic refresh mode detection signal AR and the internal RAS signal int.RAS fall to low levels, so that the signal /CEF returns to a high-level inactive state and the column enable signal /CE also enters a high-level inactive state.

Due to the aforementioned structure, it is possible to selectively allow a column selecting operation by the counter check mode detection signal CCH, so that column selection can be performed also in an automatic refresh operation to write and read the test data.

In the aforementioned structure, the operation of the column selection circuitry is inhibited in an automatic refresh operation in order to reduce power consumption. In the circuit system for allowing such column selecting operation, however, a column selecting operation is enabled simply in accordance with the internal RAS signal int.RAS also in the automatic refresh operation (similar to the arrangement that a CAS related circuit in a standard DRAM is enabled).

C: External Recognition of Refresh Bank

Figure 23:
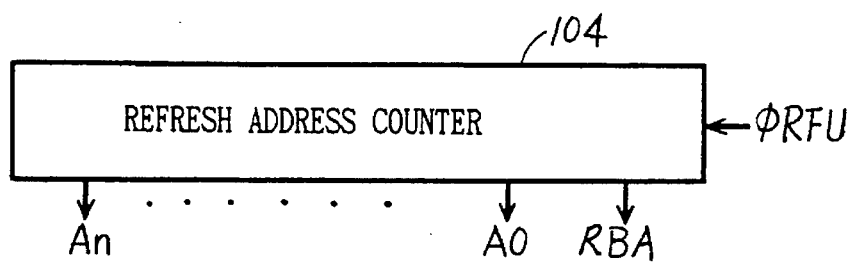
FIG. 23 illustrates refresh address bits outputted by a refresh address counter shown in FIG. 9.

FIG. 23 illustrates outputs of the refresh address counter 104. As shown in FIG. 23, the refresh address counter 104 generates refresh row address bits A0 to An and the refresh bank address RBA. This counter 104 increments its count value by 1 in accordance with the automatic refresh command detection signal φRFU received from the state decoder 180 shown in FIG. 11. Bit number of the refresh row address bits A0 to An are decided in accordance with the number of memory cells which are simultaneously refreshed (the number of word lines which are brought into selected states).

The bank address RBA is generated from the least significant bit position of the refresh address counter 104. Therefore, the bank address RBA can alternately specify the banks #1 and #2.

Figure 24:
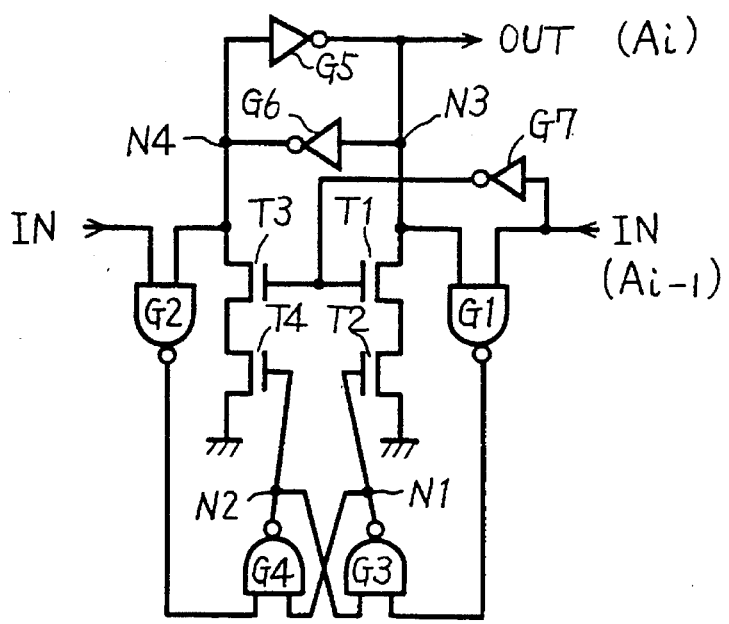
FIG. 24 illustrates a structure of a 1-bit binary counter of the refresh address counter shown in FIG. 23 for generating a refresh row address.

FIG. 24 illustrates a structure included in the address counter 104 for generating the refresh row address bits A0 to An. FIG. 24 shows only one-stage counter. (n+1) 1-bit binary counters shown in FIG. 24 are cascade-connected with each other. Referring to FIG. 24, the 1-bit binary counter (one stage of the refresh address counter 104) includes a NAND circuit G1 which receives signals on an input node IN and a node N3, a NAND circuit G3 which receives signals on the input node IN and a node N4, a NAND circuit G3 which receives an output of the NAND circuit G1 at its one input, and a NAND circuit G4 which receives an output of the NAND circuit G2 at its one input.

The NAND circuit G3 receives an output of the NAND circuit G4 at its other input, while the NAND circuit G4 receives an output of the NAND circuit G3 at its other input. Namely, the NAND circuits G3 and G4 form a NAND-type flip-flop.

The 1-bit binary counter further includes n-channel MOS (insulated gate type field-effect) transistors T1 and T3 which receive the signal on the input node IN at gates thereof through an invertor circuit G7, an n-channel MOS transistor T2 which receives the output of the NAND circuit G3 at its gate, and an n-channel MOS transistor T4 which receives the output of the NAND gate G4 at its gate. The MOS transistors T1 and T2 are serially connected between the node N3 and a ground potential in this order. The MOS transistors T3 and T4 are serially connected between the node N4 and a ground potential in this order.

Figure 25:
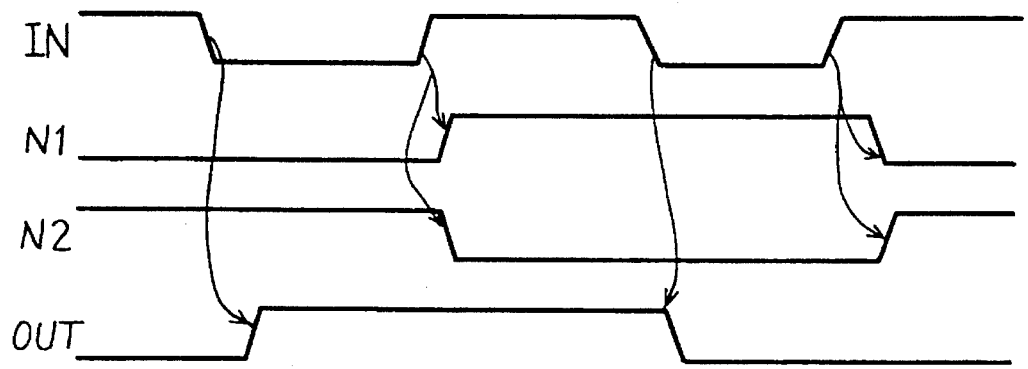
FIG. 25 is a signal waveform diagram showing an operation of the 1-bit binary counter shown in FIG. 24.

The 1-bit binary counter further includes an invertor circuit G6 which inverts the signal on the node N3 and transmits the same onto the node N4, and an invertor circuit G5 which inverts the signal on the node N4 and transmits the same onto the node N3. The node N3 is connected to an output node OUT. The invertor circuits G5 and G6 form an invertor latch. The operation of the 1-bit binary counter shown in FIG. 24 is now described with reference to an operation waveform diagram shown in FIG. 25.

It is assumed here that the input node IN (output of a preceding stage 1-bit binary counter) is at a high level and a signal potential of the output node OUT, i.e., the refresh row address bit Ai, is at a low level in an initial state. In this state, the outputs of the NAND circuits G1 and G2 are at high and low levels respectively. Therefore, the output of the NAND circuit G4, i.e., the potential of the node N2 goes high and the output of the NAND circuit G3, i.e., the potential of the node N1 goes low in response. Both of the MOS transistors T1 and T3 are in OFF states. While the transistor T2 is also in an OFF state, the transistor T4 is in an ON state.

When the signal which is supplied to the input node IN falls to a low level, both of the outputs of the NAND circuits G1 and G2 go high. In this state, the outputs of the NAND circuits G3 and G4, i.e., the signal potentials of the nodes N1 and N2 remain unchanged. On the other hand, the MOS transistors T1 and T3 enter ON states in response to the output of the invertor circuit G7. Consequently, the node N4 is discharged through the transistors T3 and T4 to a low level, while the potential of the node N3 goes high by the invertor circuit G5. Namely, the potential of the output node OUT rises to a high level from the low level.

When the signal which is supplied to the input node IN then rises to a high level from the low level, the output of the NAND circuit G1 falls to a low level, and the output of the NAND circuit G3, i.e., the potential of the node N1, rises to a high level in response. On the other hand, the output of the NAND circuit G2 is at a high level since the potential of the node N4 is at a low level. The NAND circuit G4 outputs a low-level signal since the potential of the node N1 is at a high level. Namely, the potential of the node N2 is changed from a high level to a low level. Thus, the MOS transistor T2 enters an ON state. On the other hand, the MOS transistors T1 and T3 enter OFF states in response to the output of the invertor circuit G7, whereby the potentials of the nodes N3 and N4 remain unchanged and the potential of the output node OUT maintains a high level.

Then, the signal potential of the input node IN goes low, whereby the outputs of the NAND circuits G1 and G2 go high. In this state, the potentials of the nodes N1 and N2 remain unchanged. On the other hand, the MOS transistors T1 and T3 enter ON states in response to the output of the invertor circuit G7. The MOS transistors T2 and T4 are in ON and OFF states respectively, whereby the potential of the node N3 is discharged to the ground potential level through the MOS transistors T1 and T2. Namely, the potential of the output node OUT falls to a low level, and the potentials of the nodes N3 and N4 are latched by the invertor circuits G5 and G6.

Then, the potential of the signal which is supplied to the input node IN again rises to a high level, whereby the output of the NAND circuit G2 goes low and the potential of the node N2 rises to a high level by the NAND circuit G4. On the other hand, the potential of the node N1 goes low since the NAND circuit G3 receives high-level signals in its both inputs. The MOS transistors T1 and T3 are in OFF states, and hence the state of the output node OUT remains unchanged.

This 1-bit binary counter frequency-divides the signal which is supplied to the input node IN by the factor of 2, to transmit the same to the output node OUT. Namely, the potentials of the nodes N1 and N2 are changed when the potential of the input node IN is changed from a low level to a high level, while the potential of the output node OUT is changed when the potential of the input node IN is changed from a high level to a low level. Therefore, it is possible to implement an (n+1)-bit binary counter by cascade-connecting (n+1) 1-bit binary counters shown in FIG. 24 with each other so that the output node OUT of each 1-bit binary counter is connected to an input node IN of a subsequent one.

Figure 26:
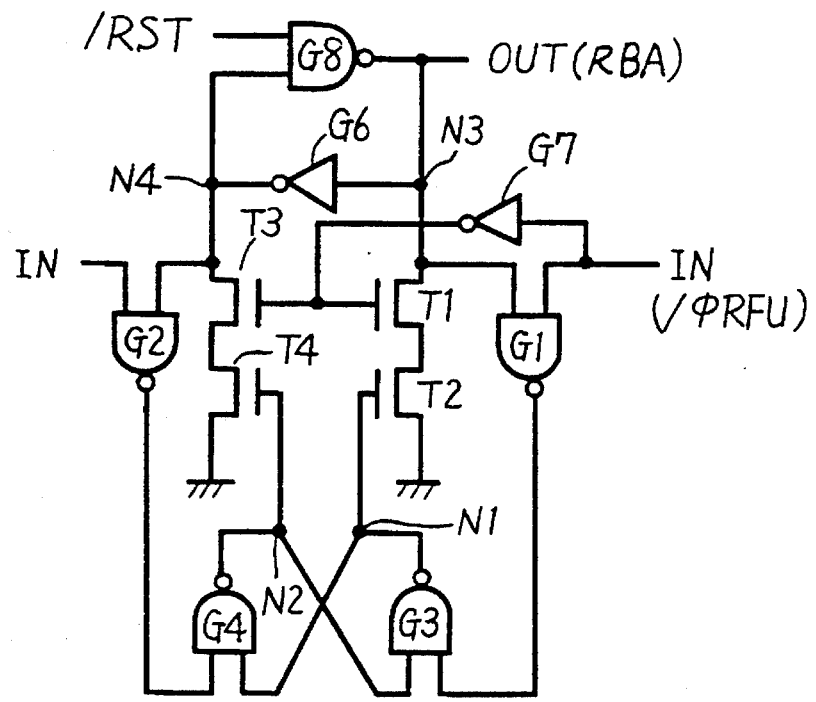
FIG. 26 illustrates a structure of another 1-bit binary counter of the refresh address counter shown in FIG. 23 for generating a refresh bank address.

FIG. 26 illustrates a structure of a part of the refresh address counter 104 for generating the refresh bank address RBA. A 1-bit binary counter shown in FIG. 26 is identical in structure to that shown in FIG. 24, except that a NAND circuit G8 is provided in place of the invertor circuit G5 which is connected to the output node OUT. Portions corresponding to those appearing in FIG. 24 are denoted by the same reference numerals.

Figure 27:
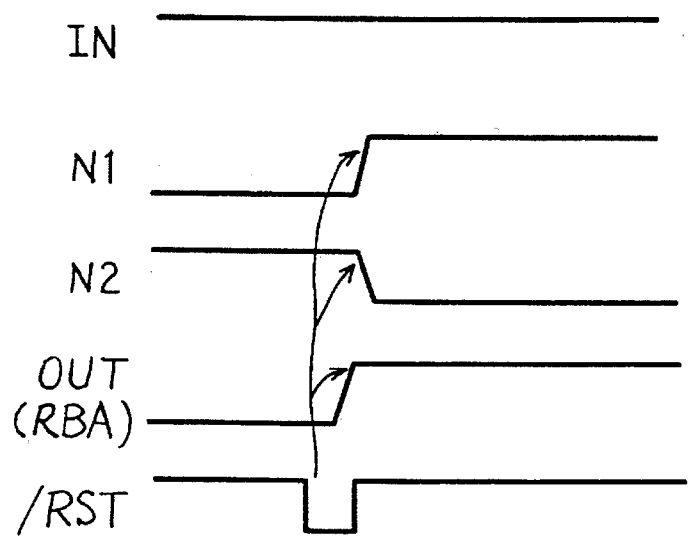
FIG. 27 is a signal waveform diagram showing an operation of the 1-bit binary counter shown in FIG. 27.

The NAND circuit G8 receives the reset signal /RST at its one input, while receiving a signal on a node N4 (output of an invertor circuit G6) at its other input. The reset signal /RST is generated in the form of one-shot pulse when a counter check mode command is supplied. The NAND circuit G8 operates as an invertor circuit when the reset signal /RST is in a high-level inactive state. In this state, therefore, the refresh bank address RBA which is generated from the output node OUT is changed every fall of a signal supplied to an input node IN, i.e., an inverted signal /ϕRFU of the automatic refresh command detection signal ϕRFU. The operation of this refresh bank address counter is now described with reference to FIG. 27 showing its operation waveform diagram.

It is assumed here that a signal potential of the input node IN is at a high level and the potential of the output node OUT is at a low level. When the reset signal /RST is in a high-level inactive state, potentials of nodes N1 and N2 go low and high respectively similarly to the operation waveform diagram shown in FIG. 25. When the reset signal /RST goes low in this state, the output of the NAND circuit G8 goes high so that the signal at the output node OUT rises to a high level. When the potential of the output node OUT, i.e., a potential of a node N3 goes high, the output of a NAND circuit G1 is changed to a low level and the output of a NAND circuit G3, i.e., the potential of the node N1, goes high in response. At this time, the output of the NAND circuit G2 is at a high level, whereby the output of a NAND circuit G4, i.e., the potential of the node N2, is changed to a low level.

When the signal which is supplied to the input node IN repeats transition between high and low levels after generation of the reset signal /RST, this counter executes a count operation similar to that of the counter shown in FIG. 24.

If the reset signal /RST enters an active state when the nodes N1 and N2 are at high and low levels respectively, the output of the input node IN goes high (the signal /ϕRFU is at a high level in an inactive state) and the output of the NAND circuit G2 also goes high, while the potential of the node N2 goes low and the potential of the node N1 maintains a high-level state. Therefore, it is possible to reset the potentials of the nodes N1 and N2 to high and low levels respectively while resetting the potential of the output node OUT to a high level regardless of the signal potentials of the nodes N1 and N2 by supplying the reset signal /RST in the form of one-shot pulse.

Figure 28:
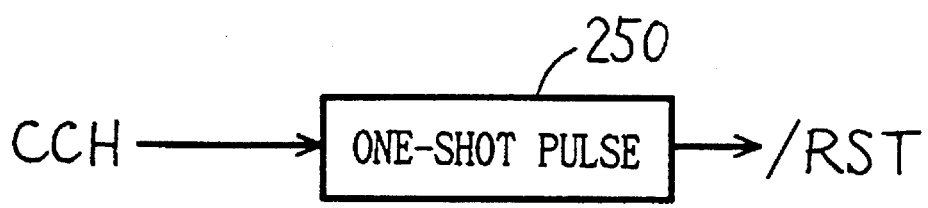
FIG. 28 illustrates a structure for generating a reset signal shown in FIG. 26.

FIG. 28 illustrates a structure for generating the reset signal /RST. Referring to FIG. 28, a one-shot pulse generation circuit 250 generates one-shot pulses in response to the counter check mode detection signal CCH. Namely, the reset signal /RST is generated in starting of a counter check mode operation.

Starting of the counter check mode has been described above with reference to FIG. 12. This counter check mode signal can be terminated through a similar structure.

When the aforementioned refresh address counter 104 is employed, its refresh address is reset to an initial value in a counter check mode operation. The count value of this refresh address counter 104 is incremented by 1 in response to a first automatic refresh command. When the bank address RBA is so initialized as to specify the bank #2 first, therefore, a refresh operation with respect to the bank #1 is executed in accordance with a next automatic refresh command, so that the banks #2 and #1 are thereafter alternately refreshed in accordance with automatic refresh commands. In the counter check mode, therefore, it is possible to recognize the currently refreshed bank from the exterior, thereby writing and reading data while specifying the bank address.

Figure 29:
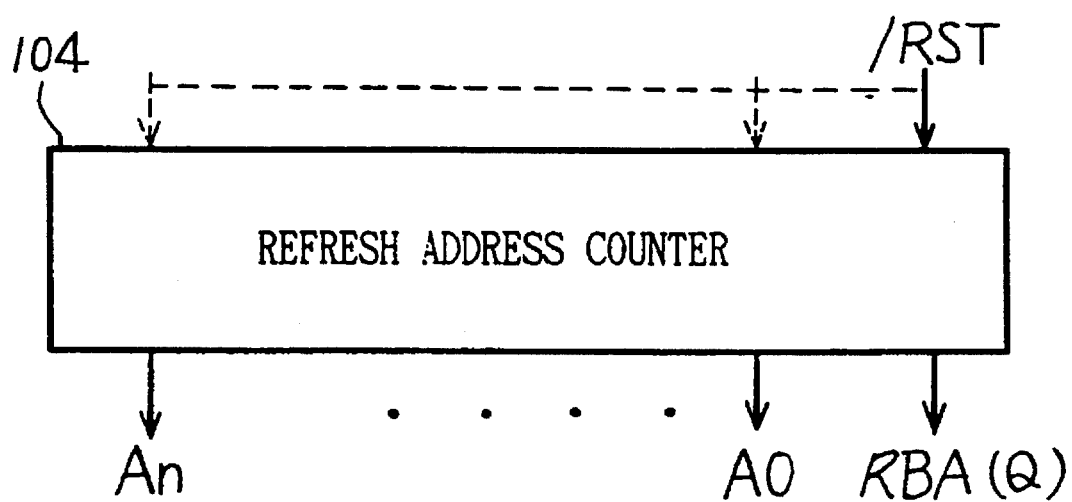
FIG. 29 illustrates another exemplary structure of the refresh address counter.

In the aforementioned structure of the refresh address counter 104, only the 1-bit binary counter for specifying the bank address is reset. Alternatively, a structure of resetting all initial values of counters generating the refresh row address bits to "0" while resetting only the bank address RBA to "1" may be employed as shown in FIG. 29. In this case, it is also possible to recognize the refresh row address from the exterior in the counter check mode. Thus, it is possible to recognize what data are written in which address of memory cells when pattern test data such as "1010 . . ." are written over a column in a counter check mode so that when the test data are read in a normal mode, the counter can be easily checked.

When no bank structure is employed in the SDRAM, a structure of simply setting the refresh row address to an initial value may be employed.

FIG. 30 is a timing chart showing an automatic refresh operation of the SDRAM according to the present invention. The inventive SDRAM automatically returns to a precharged state in its interior when an ordinary automatic refresh operation is carried out. In an automatic refresh operation of a counter check mode, on the other hand, the automatic refresh operation is completed by a precharge command. When the counter check mode is specified, further, the refresh bank address is initialized to specify a prescribed bank. The refresh operation is now described with reference to FIG. 30.

A counter check mode is specified at time T1. This counter check mode is specified by a counter check mode command signal which is directly supplied through an external pin terminal, or determined in accordance with combination of the states of the external control signals and the value of the currently supplied address signal bit. Referring to FIG. 30, the counter check mode is specified when all external control signals ext./RAS, ext./CAS and ext./WE are at high levels. In response to such specification of the counter check mode, the counter check mode detection signal CCH enters a high-level active state. The reset signal /RST is generated in the form of one-shot pulse in response, so that the refresh bank address RBA of the refresh address counter 104 is initialized at a high level.

When an automatic refresh command is supplied at a time T2 after such initialization, the refresh bank address RBA is changed to a low level in response to this automatic refresh command, to specify the bank #1. Thus, the internal RAS signal int./RASA is generated in accordance with the automatic refresh command, to execute a refresh operation with respect to the bank #1. At this time, the counter check mode is specified and the column enable signal /CE falls to a low-level in an active state after a lapse of a prescribed time upon transition of the internal RAS signal int./RASA to an active state.

A write command is supplied at time T3. At this time, a bank address and a column address are taken in in accordance with the external control signal ext./CAS. It is recognized in the exterior that the bank #1 is refreshed by the first automatic refresh command, and hence a bank address "0" for specifying the bank #1 is inputted with the write command. Thus, it is possible to write the test data in the memory cells of a specific column among selected rows of the bank #1 which is in an active state.

A precharge command is supplied at time T4. Thus, the automatic refresh operation for the bank #1 is completed and the internal RAS signal int./RASA rises to a high-level in an inactive state, while the column enable signal /CE also rises to a high level.

When an automatic refresh command is supplied at a time T5, the bank address RBA is changed to a high level in accordance with this command. Thus, an automatic refresh operation with respect to the bank #2 is executed. Namely, the internal RAS signal int./RASB for the bank #2 enters a low-level active state, and the column enable signal /CE also falls to a low level after a lapse of a prescribed time. Thus, it is possible to write the test data in the bank #2 by again supplying a write command.

In the structure shown in FIG. 30, the column enable signal /CE is generated for the banks #1 and #2 in common. Alternatively, the column enable signal /CE may be so formed as to enable column selection only with respect to a bank which is refreshed by AND operation with the refresh bank address RBA (when only the column decoder 116a or 116b is brought into an inoperable state).

In the aforementioned embodiment, the count value of the refresh address counter 104 is incremented by 1 when an automatic refresh command is inputted. Alternatively, the refresh address counter 104 may be incremented by 1 in response to fall of the automatic refresh mode detection signal AR upon completion of an automatic refresh operation. In this case, the refresh bank address RBA is initialized to be "0". The structure of resetting the count value of the refresh address counter 104 to the initial value in a specific operation mode is also applicable to an ordinary DRAM.

The test data are read in a normal mode, or through an automatic refresh command and a read command (a read command is supplied in place of the write command in FIG. 30).

According to the present invention, completion timing of a refresh operation can be set from the exterior in accordance with an operation mode. Thus, it is possible to reliably write data in the selected memory cells in a counter check mode. Further, it is possible to set a refresh cycle period in the exterior when only a data holding operation is carried out in a stand-by period, for example. Thus, it is possible to reliably write data which are raised up to a power source voltage level by increasing a sense amplifier operating period when an external power source voltage is reduced in a data holding operation, for example, thereby reliably holding the data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device having a plurality of dynamic memory cells requiring refresh operations and taking in external signals in synchronization with a clock signal being formed of a series of pulses, said synchronous semiconductor memory device comprising:

refresh address generation means for generating a refresh address for specifying a memory cell to be refreshed among said plurality of dynamic memory cells;

refresh means for refreshing said memory cell specified by said refresh address generated from said refresh address generation means in response to a refresh designating signal;

first inactivation means for inactivating said refresh means after a lapse of a prescribed time in response to said refresh designating signal;

second inactivation means for inhibiting said first inactivation means from operation in response to a first operation mode designating signal being different from said refresh designating signal; and third inactivation means for inactivating said refresh means in response to a second operation mode designating signal.

2. A synchronous semiconductor memory device in accordance with claim 1, further comprising reset means for resetting said refresh address generated from said refresh address generation means at a prescribed value in response to said first operation mode designating signal.

3. A synchronous semiconductor memory device in accordance with claim 1, wherein
said dynamic memory cells are arranged in a matrix of rows and columns, and wherein
said synchronous semiconductor memory device further comprises column selection inhibiting means for inhibiting an operation to select a column among said columns in response to said refresh designating signal.

4. A synchronous semiconductor memory device taking in external signals in synchronization with a clock signal formed of a series of pulses, said synchronous semiconductor memory device comprising:
a plurality of banks each having a plurality of dynamic memory cells requiring refresh operations, said banks being activated independently of each other;
an address counter for generating a refresh address specifying memory cells of said memory cells and a bank out of said banks to be refreshed;
refresh means for refreshing the memory cells of the bank specified by said refresh address generated from said address counter in response to a refresh designating signal; and
initialization means for initializing at least a bank address specifying one of said banks in said refresh address being generated from said address counter at an address specifying a prescribed one of said banks.

5. A synchronous semiconductor memory device in accordance with claim 4, wherein said dynamic memory cells are arranged in a matrix of rows and columns, and the synchronous semiconductor memory device further comprises
column selection inhibiting means for inhibiting an operation to select a column among said columns in response to said refresh designating signal; and
column selection control means for inactivating said column selection inhibiting means thereby enabling a column selecting operation in response to said first operation mode designating signal.

6. A synchronous semiconductor device operating in synchronization with a clock signal, comprising:
a memory cell array having a plurality of dynamic type memory cells arranged in rows and columns;
refresh mode detection means responsive to a refresh designating signal applied in synchronization with said clock signal for detecting that a refresh mode of operation is designated to generate a refresh mode detecting signal;
refresh address generation means responsive to said refresh mode detecting signal for generating a refresh address signal designating a row of memory cells to be refreshed in said memory cell array;
refresh means responsive to said refresh mode detecting signal and said refresh address signal for refreshing data of the row of memory cells; and
setting means responsive to an operation mode indicating signal indicating a particular operation mode, for determining a timing at which said refresh means is disabled to terminate the refreshing of data of said row of memory cells.

7. The device according to claim 6, wherein said setting means includes means for enabling said refresh means only for a predetermined time period when said refresh mode indicating signal is in an inactive state not to indicate the particular operation mode.

8. The device according to claim 6, wherein said setting means includes means for maintaining said refresh means at an enabled state until a refresh termination signal is applied in synchronization with a clock signal when said refresh mode indicating signal is in an active state.

9. The device according to claim 6, further comprising column selection inhibition means responsive to said refresh mode designating signal for inhibiting an operation of selecting a column in said columns in accordance with a column address signal applied in synchronization with said clock signal.

10. The device according to claim 9,
further comprising release means responsive to said refresh mode indicating signal for setting free the column selection operation inhibited by said column selection inhibition means to allow external access to a memory cell designated by said refresh address signal and said column address signal when said refresh mode indicating signal is active.

11. The device according to claim 6, further comprising means responsive to said refresh mode indicating signal being active for enabling a column selection operation selecting a column among said columns in accordance with a column address signal applied in synchronization with said clock signal.

12. The device according to claim 6, wherein said refresh address generation means includes a refresh address counter for generating said refresh address signal and reset means responsive to said operation mode indicating signal being active for resetting a count value of said refresh address counter to a predetermined initial value.

13. The device according to claim 6, wherein said memory array is divided into a plurality of banks each independently accessible of others, and wherein said refresh address generation means includes a refresh address counter generating as said refresh address signal a refresh row address signal designating a row of memory cells and a bank designating signal for designating a bank out of said plurality of banks, and resetting means responsive to said operation mode indicating signal being active for initializing said bank designating signal to a state indicating a predetermined bank among said plurality of banks.

14. The device according to claim 6, wherein said operation mode indicating signal designates a counter check mode operation in which it is checked whether said refresh address generation means correctly operates to generate said refresh address signal.

15. The device according to claim 6, wherein said refresh designating signal is represented by a plurality of control signals set at a predetermined combination of states upon a transition of said clock signal.

16. The device according to claim 6, wherein said operation mode indicating signal is represented by a plurality of external signals set in a predetermined combination of states upon a transition of said clock signal.

17. The device according to claim 16, wherein said plurality of external signals include a predetermined control signal and a predetermined bit of a multibit external address signal.

18. The device according to claim 6, wherein said setting means includes;
disabling means responsive to said refresh mode detecting signal for disabling said refresh means after elapse of a predetermined time period since generation of said refresh mode detecting signal, operation mode detecting means in response to said operation mode detecting signal for detecting that said particular operation mode is designated and for inhibiting said disabling means from operation, termination mode detection means responsive to a precharge indicating signal designating that a memory cell selected in said memory cell array should be brought into a non-selected state in a stand-by state, and termination means responsive to said disabling means and termination mode detection means for disabling said refresh means to terminate the refreshing of data of said row of memory cells designated by said refresh address signal.

19. The device according to claim 18, wherein said operation mode detecting means includes means for bringing an output of said disabling means fixedly at an inactive state indicating maintenance of the refreshing when said operation mode indicating signal designates said particular operation mode.

20. The device according to claim 18, wherein said precharge indicating signal is represented by a plurality of control signals set in a predetermined combination of states upon transition of said clock signal.

21. The device according to claim 6, wherein said refresh means includes means responsive to said refresh mode detection means for generating a row address strobe signal initiating an operation for selecting a row of memory cells in said memory cell array, and wherein said setting means includes means for disabling said row address strobe signal at a timing determined according to said operation mode indicating signal.

22. A synchronous semiconductor memory device operating in synchronization with a clock signal, comprising:

a memory cell array having a plurality of dynamic type memory cells arranged in rows and columns;

row selection means responsive to an applied row address signal for selecting a row of memory cells in said memory cell array;

an address generation means responsive to a refresh designating signal applied in synchronization with said clock signal, for generating and applying a refresh address signal designating a row of memory cells to be refreshed to said row selection means;

enabling means responsive to a counter check mode indicating signal indicating an operation mode in which whether said address generation means correctly operates to generate refresh addresses should be checked, for allowing said column selection means to select a column in said memory cell array in accordance with an external address signal.

23. A synchronous semiconductor memory device operating in synchronization with a clock signal, comprising:

a memory cell array having a plurality of memory cells arranged in rows and columns;

refresh address generation means responsive to a refresh designating signal for generating a refresh address signal specifying a row of memory cells on said memory cell array;

refresh means responsive to said refresh designating signal for refreshing data of said row of memory cells specified by said refresh address signal; and resetting means responsive to a predetermined operation mode indicating signal for resetting a refresh address signal to be generated from said refresh address generation means to a predetermined initial value.

24. The device according to claim 23, wherein said refresh address generation means includes an address counter having a count supplied as said refresh address signal and changed in value by 1 upon each application of said refresh designation signal.

25. A synchronous semiconductor device operating in synchronization with a clock signal, comprising:

a memory cell array having a plurality of dynamic type memory cells arranged in rows and columns;

refresh mode detection means responsive to a refresh designating signal applied in synchronization with said clock signal for detecting that a refresh mode of operation is designated to generate a refresh mode detecting signal;

refresh address generation means responsive to said refresh mode detecting signal for generating a refresh address signal designating a row of memory cells to be refreshed in said memory cell array;

refresh means responsive to said refresh mode detecting signal and said refresh address signal for refreshing data of the row of memory cells;

setting means responsive to an operation mode indicating signal indicating a particular operation mode, for determining a timing at which said refresh means is disabled to terminate the refreshing of data of said row of memory cells;

column selection inhibition means responsive to said refresh mode designating signal for inhibiting an operation of selecting a column in said columns in accordance with a column address signal applied in synchronization with said clock signal; and release means responsive to said refresh mode indicating signal for setting free the column selection operation inhibited by said column selection inhibition means to allow external access to a memory cell designated by said refresh address signal and said column address signal when said refresh mode indicating signal is active.

26. A synchronous semiconductor device operating in synchronization with a clock signal, comprising:

a memory cell array having a plurality of dynamic type memory cells arranged in rows and columns;

refresh mode detection means responsive to a refresh designating signal applied in synchronization with said clock signal for detecting that a refresh mode of operation is designated to generate a refresh mode detecting signal;

refresh address generation means responsive to said refresh mode detecting signal for generating a refresh address signal designating a row of memory cells to be refreshed in said memory cell array;

refresh means responsive to said refresh mode detecting signal and said refresh address signal for refreshing data of the row of memory cells; and setting means responsive to an operation mode indicating signal indicating a particular operation mode, for determining a timing at which said refresh means is disabled to terminate the refreshing of data of said row of memory cells, wherein said operation mode indicating signal designates a counter check mode operation in which it is checked whether said refresh address generation means correctly operates to generate said refresh address signal.

27. A synchronous semiconductor device operating in synchronization with a clock signal, comprising:
  a memory cell array having a plurality of dynamic type memory cells arranged in rows and columns;
  refresh mode detection means responsive to a refresh designating signal applied in synchronization with said clock signal for detecting that a refresh mode of operation is designated to generate a refresh mode detecting signal;
  refresh address generation means responsive to said refresh mode detecting signal for generating a refresh address signal designating a row of memory cells to be refreshed in said memory cell array;
  refresh means responsive to said refresh mode detecting signal and said refresh address signal for refreshing data of the row of memory cells; and
  setting means responsive to an operation mode indicating signal indicating a particular operation mode, for determining a timing at which said refresh means is disabled to terminate the refreshing of data of said row of memory cells, wherein said setting means includes
    disabling means responsive to said refresh mode detecting signal for disabling said refresh means after elapse of a predetermined time period since generation of said refresh mode detecting signal,
    operation mode detecting means in response to said operation mode detecting signal for detecting that said particular operation mode is designated and for inhibiting said disabling means from operation,
    termination mode detection means responsive to a precharge indicating signal designating that a memory cell selected in said memory cell array should be brought into a non-selected state in a stand-by state, and
    termination means responsive to said disabling means and termination mode detection means for disabling said refresh means to terminate the refreshing of data of said row of memory cells designated by said refresh address signal.

28. The device of claim 27, wherein said precharge indicating signal is represented by a plurality of control signals set in a predetermined combination of states upon transition of said clock signal.

29. The device according to claim 27, wherein said operation mode detecting means includes means for bringing an output of said disabling means fixedly at an inactive state indicating maintenance of the refreshing when said operation mode indicating signal designates said particular operation mode.

* * * * *